United States Patent
Li et al.

(10) Patent No.: US 12,506,120 B2
(45) Date of Patent: Dec. 23, 2025

(54) DISPLAY STRUCTURE FOR ELECTRONIC DEVICES

(71) Applicant: Apple Inc., Cupertino, CA (US)

(72) Inventors: Xia Li, San Jose, CA (US); Tore Nauta, Santa Cruz, CA (US); Gilbert Huppert, San Jose, CA (US); Dongwoo Shin, San Jose, CA (US); Hjalmar Edzer Ayco Huitema, Lexington, MA (US); Ruize Xu, Campbell, CA (US); Wei Lin, Santa Clara, CA (US); Nathan K. Gupta, San Francisco, CA (US); Kian Kerman, San Jose, CA (US); Elmar Gehlen, San Jose, CA (US); Jin Yan, San Jose, CA (US); Se Hyun Ahn, Santa Clara, CA (US); Young Cheol Yang, Sunnyvale, CA (US); Arnoldus Alvin Barlian, San Francisco, CA (US); Ran He, San Jose, CA (US); Francois R. Jacob, Sunnyvale, CA (US); Brent J. Bollman, Alameda, CA (US); Wei-Liang Hsu, San Jose, CA (US); Di Liu, San Jose, CA (US); Jonathan P. Mar, San Mateo, CA (US)

(73) Assignee: Apple Inc., Cupertino, CA (US)

( * ) Notice: Subject to any disclaimer, the term of this patent is extended or adjusted under 35 U.S.C. 154(b) by 555 days.

(21) Appl. No.: 17/997,509

(22) PCT Filed: May 3, 2021

(86) PCT No.: PCT/US2021/030498
§ 371 (c)(1),
(2) Date: Oct. 28, 2022

(87) PCT Pub. No.: WO2021/225971
PCT Pub. Date: Nov. 11, 2021

(65) Prior Publication Data
US 2023/0178526 A1 Jun. 8, 2023

Related U.S. Application Data

(60) Provisional application No. 63/022,360, filed on May 8, 2020, provisional application No. 63/022,363, filed
(Continued)

(51) Int. Cl.
| H01L 25/075 | (2006.01) |
| G02B 5/30 | (2006.01) |
| H10H 29/14 | (2025.01) |

(52) U.S. Cl.
CPC ........ *H01L 25/0753* (2013.01); *G02B 5/3033* (2013.01); *H10H 29/14* (2025.01)

(58) Field of Classification Search
CPC . H01L 25/0753; H01L 25/167; G02B 5/3033; H10H 29/14; B32B 15/00;
(Continued)

(56) References Cited

U.S. PATENT DOCUMENTS

| 11,094,895 B2 | 8/2021 | Dai |
| 2012/0111479 A1 | 5/2012 | Sung et al. |

(Continued)

FOREIGN PATENT DOCUMENTS

| CN | 109858417 A | 6/2019 |
| CN | 210072572 U | 2/2020 |

(Continued)

OTHER PUBLICATIONS

EP21799878, "Communication Pursuant to Rule 164(1) EPC and The Supplementary Partial European Search Report", Mailed Apr. 30, 2024, 15 pages.

(Continued)

*Primary Examiner* — Ratisha Mehta
(74) *Attorney, Agent, or Firm* — Aikin & Gallant, LLP

(57) ABSTRACT

Display structures and methods of manufacture of display structure including a display panel with a curved three-dimensional film contour are described. In an embodiment, a display panel includes display area with a main body area and a plurality of petals extending from the main body area. The petals are folded into a curved three-dimensional (3D)

(Continued)

film contour, and are separated by corresponding trenches between petals. The trenches may be filled with various seam hiding materials to visually obscure the trenches.

24 Claims, 31 Drawing Sheets

Related U.S. Application Data on May 8, 2020, provisional application No. 63/022,367, filed on May 8, 2020.

(58) Field of Classification Search
CPC .......... B32B 2255/10; B32B 2255/26; B32B 2307/546; B32B 2457/20; B32B 7/12; B32B 27/281; B32B 27/36; G09G 2300/0452
See application file for complete search history.

(56) References Cited

U.S. PATENT DOCUMENTS

| | | |
|---|---|---|
| 2018/0039352 A1* | 2/2018 | Wu .................. H10K 59/40 |
| 2018/0322826 A1* | 11/2018 | Lee .................. G06F 1/1652 |
| 2019/0035765 A1 | 1/2019 | Kim et al. |
| 2019/0096864 A1 | 3/2019 | Huitema et al. |
| 2019/0207167 A1 | 7/2019 | Lee |
| 2019/0347989 A1 | 11/2019 | Lee et al. |
| 2020/0142449 A1 | 5/2020 | Nakatogawa |
| 2021/0265580 A1 | 8/2021 | Jung et al. |

FOREIGN PATENT DOCUMENTS

| | | |
|---|---|---|
| KR | 10-2017-0091287 A | 8/2017 |
| WO | 2019168763 A1 | 9/2019 |

OTHER PUBLICATIONS

International Search Report and Written Opinion for International Application No. PCT/US2021/030498, 9 pages.

* cited by examiner

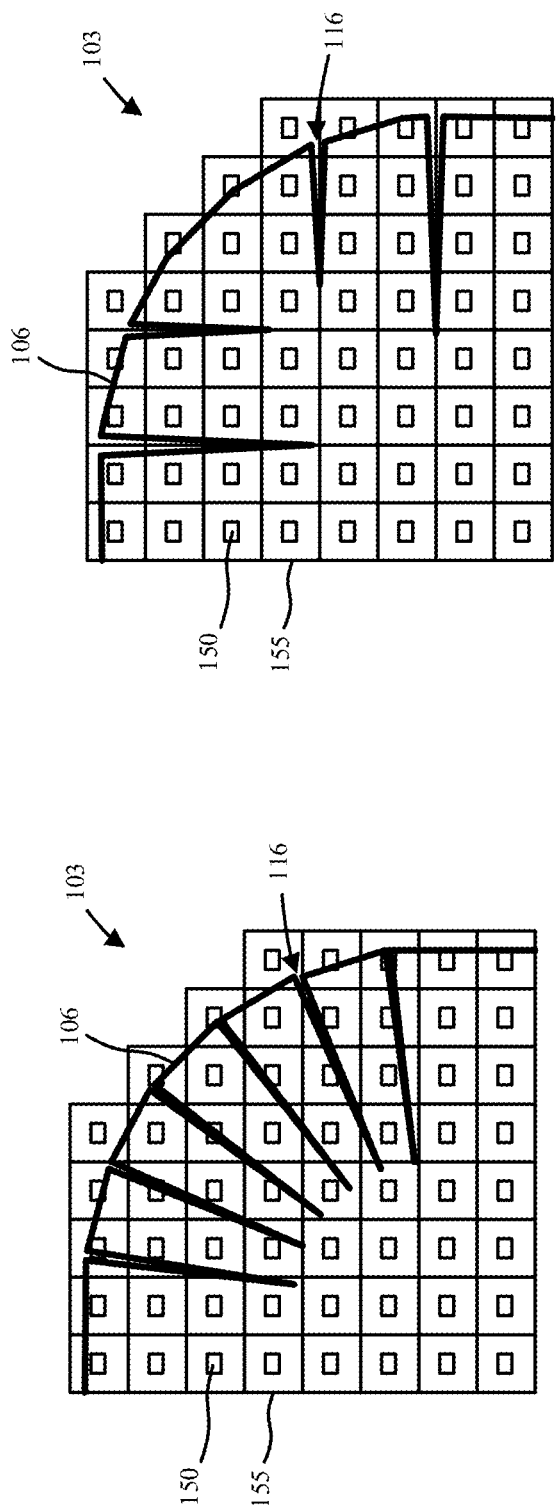
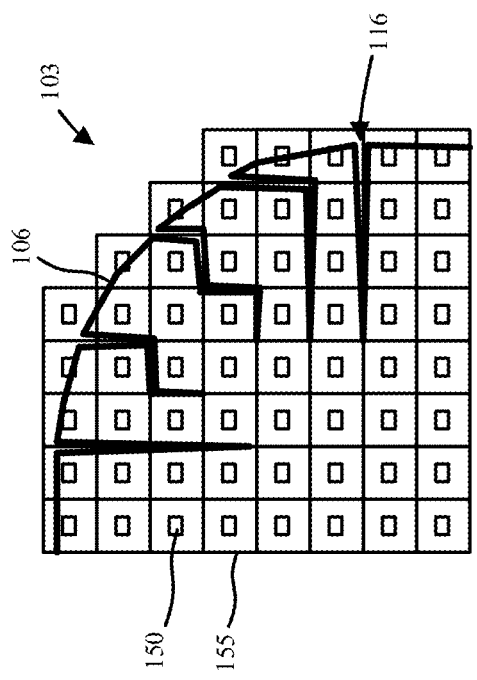
FIG. 26A
FIG. 26B
FIG. 27

DISPLAY STRUCTURE FOR ELECTRONIC DEVICES

RELATED APPLICATIONS

This patent application is a U.S. National Phase Application under 35 U.S.C § 371 of International Application No. PCT/US2021/030498, filed May 3, 2021, entitled "CUT AND FOLDED DISPLAY WITH 3D COMPOUND CURVATURE", which claims the benefit of priority of U.S. Provisional Application No. 63/022,360 filed May 8, 2020, U.S. Provisional Application No. 63/022,363 filed May 8, 2020, and U.S. Provisional Application No. 63/022,367 filed May 8, 2020, each of which is herein incorporated by reference in their entirety.

BACKGROUND

Field

Embodiments described herein relate to display systems.

Background Information

State of the art displays for electronic devices such as wearable devices, portable electronics, desktop computers, and televisions are based on liquid crystal display (LCD) or organic light emitting diodes (OLED) technologies. More recently, it has been proposed to incorporate emissive inorganic semiconductor-based micro LEDs into high resolution displays, with the potential for energy efficiency and being less prone to lifetime degradation and sensitivity to moisture.

Display panel edges have traditionally included a non-display area along sides of the display panel to accommodate connection of components associated with the display panel function. A current trend is the drive to reduced edge areas to maximize display area size of the display panel. This can be attributed to both aesthetic appeal and the incorporation of touch interfaces. Even more recently, it has been proposed to expand the display area over a curved edge of a device. In one implementation, a display panel includes a curved two-dimensional film, or 2.5D film contour that is curved about an axis near an edge of the display panel.

SUMMARY

Embodiments describe display structures and methods of manufacture of display structures including a display panel with a curved three-dimensional film contour. In an embodiment, a display structure includes a display panel with pixel circuitry connected to a matrix of LEDs within a display area of the display panel. The display area includes a main body area and a plurality of petals extending from the main body area. A cutout is formed through the display panel and defines a first edge of a first petal of the plurality of petals and a second edge of a second petal of the plurality of petals. In accordance with embodiments, the first and second petals are folded in a curved three-dimensional (3D) film contour, and a trench is located between the first petal to the second petal within the curved 3D film contour. The cutout patterns used to form the petals may include straight cuts, orthogonal straight cuts, zigzag patterns, etc. Additionally, various pixel patterns, subpixel arrangements, and tile patterns are described to accommodate the cutout patterns.

Various lamination techniques are described in accordance with embodiments to achieve precise alignment of the petals in order to reduce visibility of the trenches. In an embodiment, a method of forming a display structure includes laminating a backfilm layer onto a bottom mold with a 3D compound surface curvature, and laminating a display panel onto the backfilm layer on the bottom mold. The display panel includes a cutout pattern that defines a plurality of petals, and laminating the display panel includes folding the plurality of petals into a curved 3D film contour on top of the laminated backfilm layer. Lamination may be performed using passive, guided, and active alignment techniques. In an embodiment, an active alignment technique includes pulling one or more connecting lines attached to a backfilm layer between the display panel and a bottom mold to fold a plurality of petals. In an embodiment, an active alignment technique includes pulling a plurality of tabs along a periphery of a protective film to fold the plurality of petals. In an embodiment, an active alignment technique includes pulling a strip of a protective film tab to fold a petal.

Embodiments also describe various structures for seam hiding, or obscuring visibility of the trenches by filling the trenches with one or more seam materials, and integration of polarizer layer stack-ups, diffusers and black matrix materials.

BRIEF DESCRIPTION OF THE DRAWINGS

FIG. 26A is a schematic top view illustration of a straight-line cutout pattern over a regular array of matrix tiles in accordance with an embodiment.

FIG. 26B is a schematic top view illustration of an orthogonal straight-line cutout pattern over a regular array of matrix tiles in accordance with an embodiment.

FIG. 27 is a schematic top view illustration of a zigzag cutout pattern over a regular array of matrix tiles in accordance with an embodiment.

DETAILED DESCRIPTION

Figure 1:
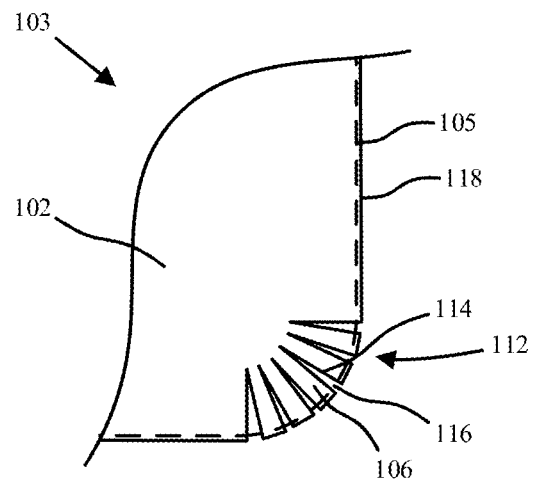
FIG. 1 is a schematic top view illustration of a display panel including a main body area and a plurality of petals extending from the main body area in accordance with an embodiment.

Embodiments describe display panel configurations and manufacturing techniques to form display panel areas with three-dimensional (3D) compound film curvature. In particular, embodiments describe display panel cut and folding concepts to facilitate folding of a 2D display panel film into a 3D compound film curvature, for example along corners or a dome shaped display.

In an embodiment, a display structure includes a display panel which includes pixel circuitry connected to a matrix of light emitting diodes (LEDs) within a display area of the display panel. The display area may include main body area and a plurality of petals extending from the main body area. For example, the main body area can be flat, dome shaped, or curved with a 2.5D curvature. One or more cutouts are formed through the display panel to define edges of the petals. The cutouts in accordance with embodiments can be provided by cutting techniques, such as laser cutting, or alternatively be pre-patterned. In accordance with embodiments, the petals are folded in a 3D film contour with trenches between adjacent petals, also within the curved 3D film contour.

In one aspect, embodiments describe solutions for integrating traditional 2D display panel architectures into a folded 3D compound film curvature. In some embodiments, particular cut designs are described to mitigate optical artifacts associated with either cutting through LEDs, cutting through display panel wiring, or misalignment of folded LED matrices. Exemplary designs can include specific cut patterns, pixel arrangements, subpixel clustering, pixel driver chip arrangement, and routing of global routing paths.

In another aspect, embodiments describe 3D lamination techniques to achieve precise petal alignment. Exemplary 3D lamination techniques include passive, guided, and active alignment techniques. Exemplary active alignment techniques include press molding with an oversized protective film with pull tabs, and strip lamination.

In another aspect, embodiments describe trench (or seam) hiding techniques to reduce optical emission artifacts such as glowing at trench edges, and optical reflection artifacts such as visible trenches (white) in display off-state or visible trenches (dark) in display on-state. Various trench filling and polarizer structures are described to assist with trench hiding.

In yet another aspect, embodiments describe polarizer coating sequences to form polarizer layers directly on 3D surfaces.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 2:
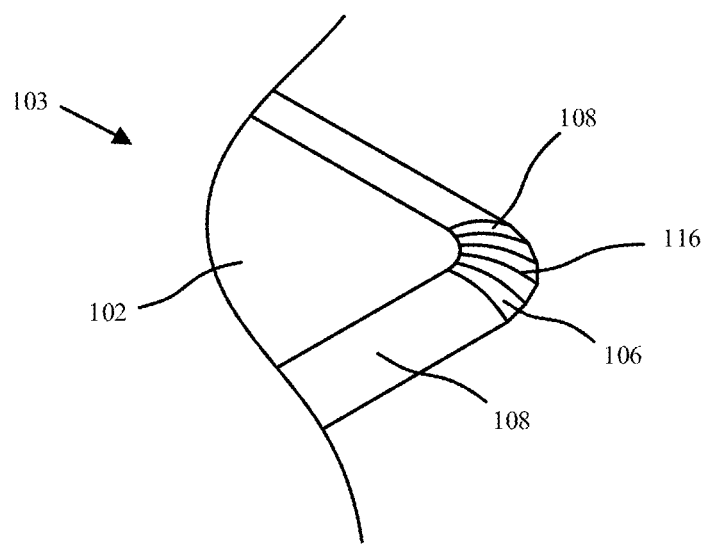
FIG. 2 is a perspective view illustration of a display panel including a plurality of petals folded in a curved three-dimensional (3D) film contour in accordance with an embodiment.

Referring now to FIGS. 1-2, FIG. 1 is a schematic top view illustration of a display panel 103 including a main body area 102 and a plurality of petals 106 extending from the main body area 102 in accordance with an embodiment; FIG. 2 is a perspective view illustration of a display panel 103 including a plurality of petals 106 folded in a curved 3D film contour in accordance with an embodiment. More specifically, FIG. 2 is an illustration of curved edges 108 after folding a flat pre-cut display panel 103 of FIG. 1. As shown in both FIGS. 1-2, a cutout 112 is formed through the display panel 103 to define edges 114 of the petals 106, and corresponding trenches 116 that will be present before and after folding into the curved 3D film contour. In this manner, the display area 105 of the display panel 103 can extend near the edges 118 of the display panel 103, along the curved edges 108 and petals 106 that are folded into the curved 3D film contour. In accordance with embodiments the main body area 102 may be flat or curved, and may be surrounded by curved edges 108, including those of petals 106 folded into a curved 3D film contour. Edges 108 may also include curved 2D film contour, for example, along straight edges of a display panel between corners.

Figure 3:
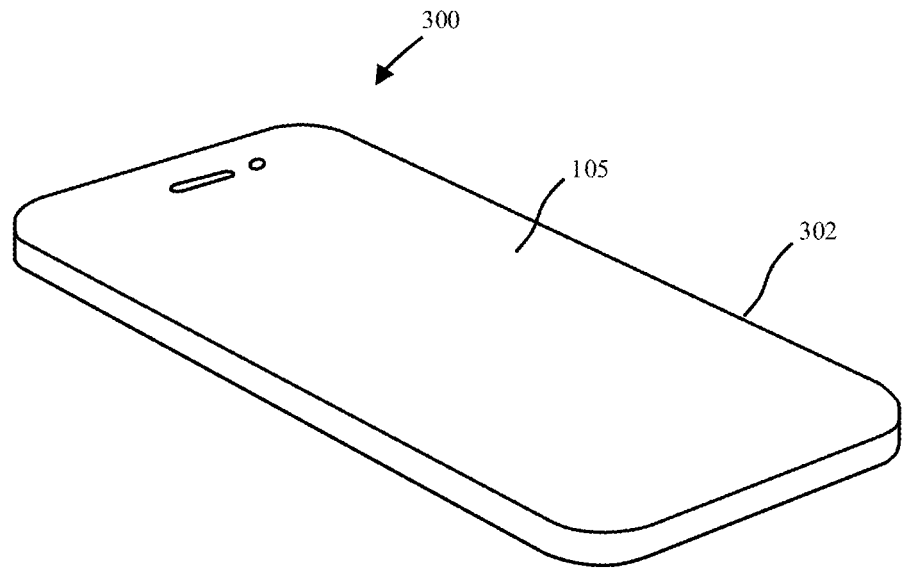
FIG. 3 is an isometric view of a mobile telephone in accordance with an embodiment.
Figure 4:
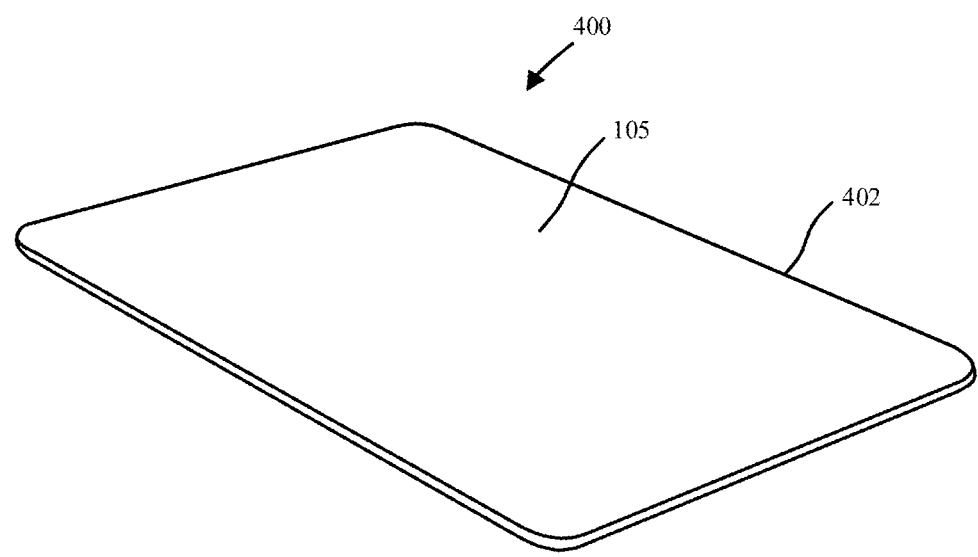
FIG. 4 is an isometric view of a tablet computing device in accordance with an embodiment.
Figure 5:
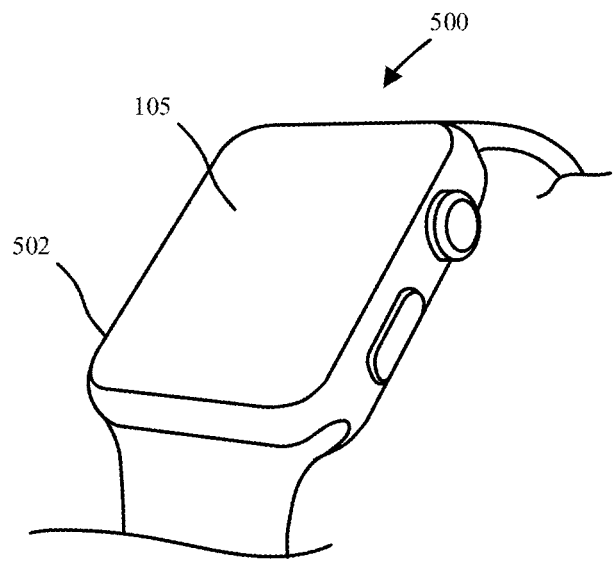
FIG. 5 is an isometric view of a wearable device in accordance with an embodiment.
Figure 6:
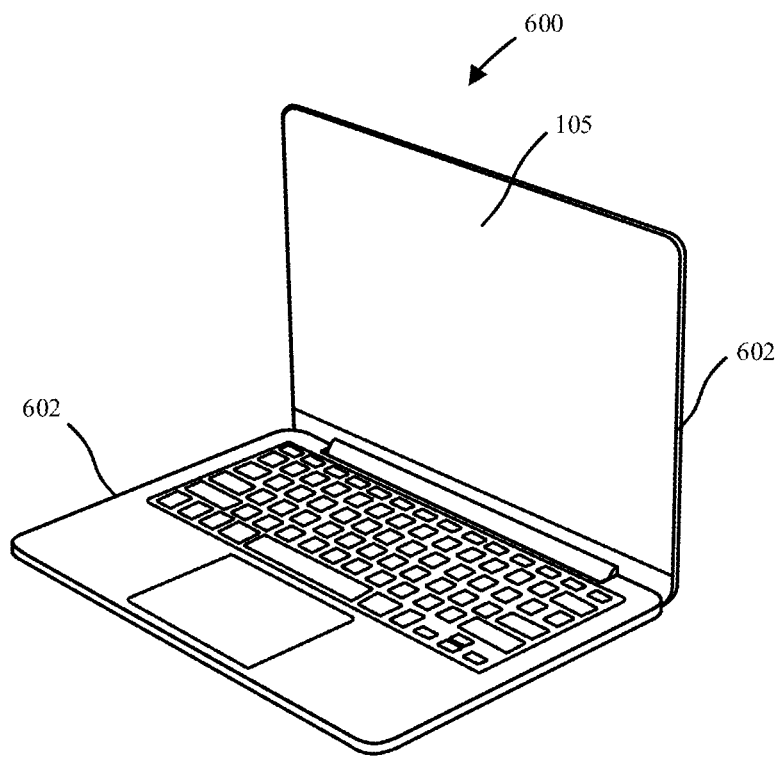
FIG. 6 is an isometric view of a laptop computer in accordance with an embodiment.

FIGS. 3-6 illustrate various portable electronic systems in which the various embodiments can be implemented. FIG. 3 illustrates an exemplary mobile telephone 300 that includes a display structure including a display area 105 packaged in a housing 302. FIG. 4 illustrates an exemplary tablet computing device 400 that includes a display structure including a display area 105 packaged in a housing 402. FIG. 5 illustrates an exemplary wearable device 500 that includes a display structure including a display area 105 packaged in a housing 502. FIG. 6 illustrates an exemplary laptop computer 600 that includes a display structure including a display area 105 packaged in a housing 602. In each embodiment, the display structure can have a display area 105 with a curved three-dimensional (3D) film contour.

Figure 7:
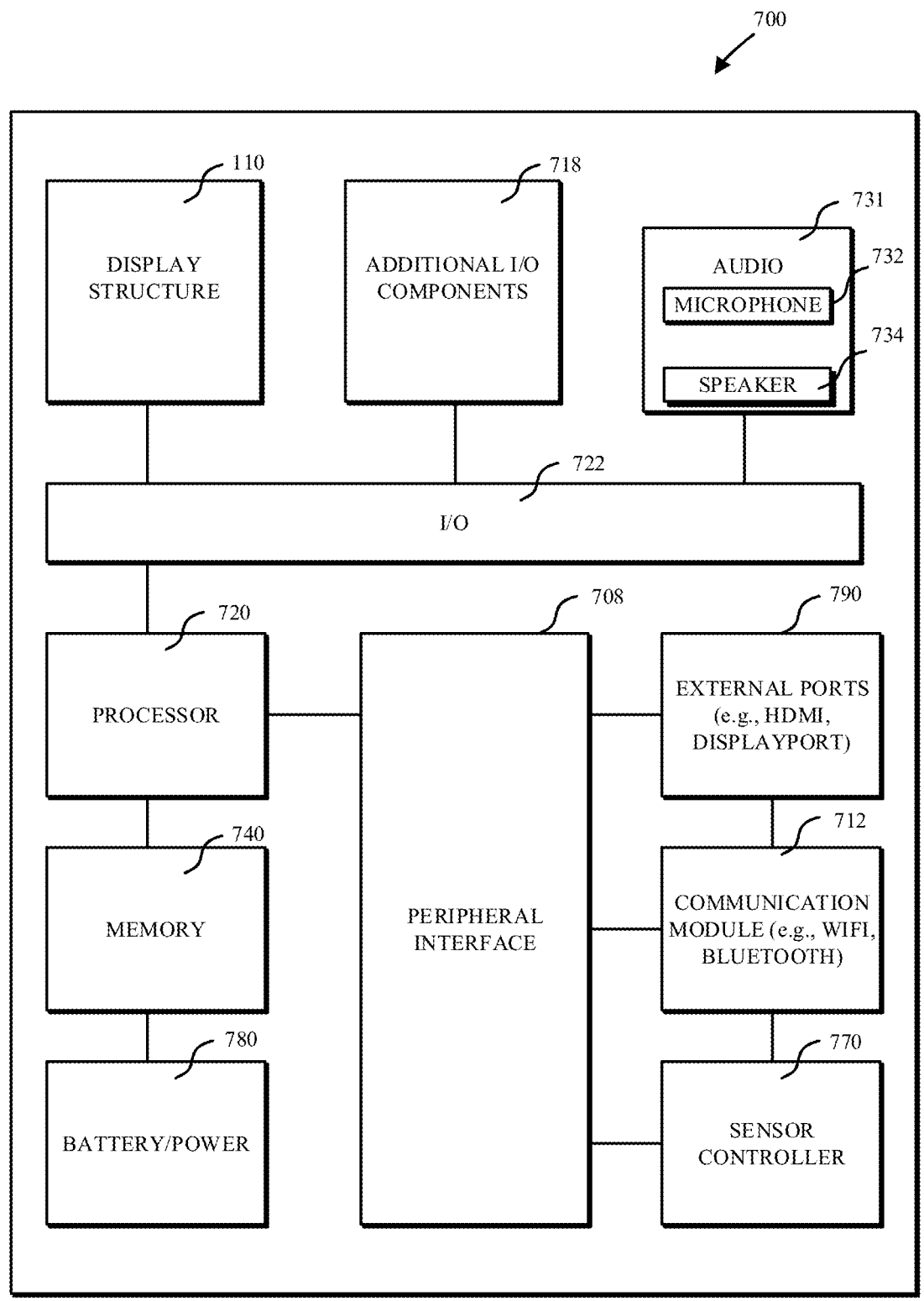
FIG. 7 is a system diagram of a portable electronic device in accordance with an embodiment.

FIG. 7 illustrates a system diagram for an embodiment of a portable electronic device 700 including a display structure 110 described herein. The portable electronic device 700 includes a processor 720 and memory 740 for managing the system and executing instructions. The memory includes non-volatile memory, such as flash memory, and can additionally include volatile memory, such as static or dynamic random access memory (RAM). The memory 740 can additionally include a portion dedicated to read only memory (ROM) to store firmware and configuration utilities.

The system also includes a power module 780 (e.g., flexible batteries, wired or wireless charging circuits, etc.), a peripheral interface 708, and one or more external ports 790 (e.g., Universal Serial Bus (USB), HDMI, Display Port, and/or others). In one embodiment, the portable electronic device 700 includes a communication module 712 configured to interface with the one or more external ports 790. For example, the communication module 712 can include one or more transceivers functioning in accordance with IEEE standards, 3GPP standards, or other communication standards, 4G, 5G, etc. and configured to receive and transmit data via the one or more external ports 790. The communication module 712 can additionally include one or more WWAN transceivers configured to communicate with a wide area network including one or more cellular towers, or base stations to communicatively connect the portable electronic device 700 to additional devices or components. Further, the communication module 712 can include one or more WLAN and/or WPAN transceivers configured to connect the portable electronic device 700 to local area networks and/or personal area networks, such as a Bluetooth network.

The portable electronic device 700 can further include a sensor controller 770 to manage input from one or more sensors such as, for example, proximity sensors, ambient light sensors, or infrared transceivers. In one embodiment the system includes an audio module 731 including one or more speakers 734 for audio output and one or more microphones 732 for receiving audio. In embodiments, the speaker 734 and the microphone 732 can be piezoelectric components. The portable electronic device 700 further includes an input/output (I/O) controller 722, a display structure 110, and additional I/O components 718 (e.g., keys, buttons, lights, LEDs, cursor control devices, haptic devices, and others). The display structure 110 and the additional I/O components 718 may be considered to form portions of a user interface (e.g., portions of the portable electronic device 700 associated with presenting information to the user and/or receiving inputs from the user).

Figure 8A:
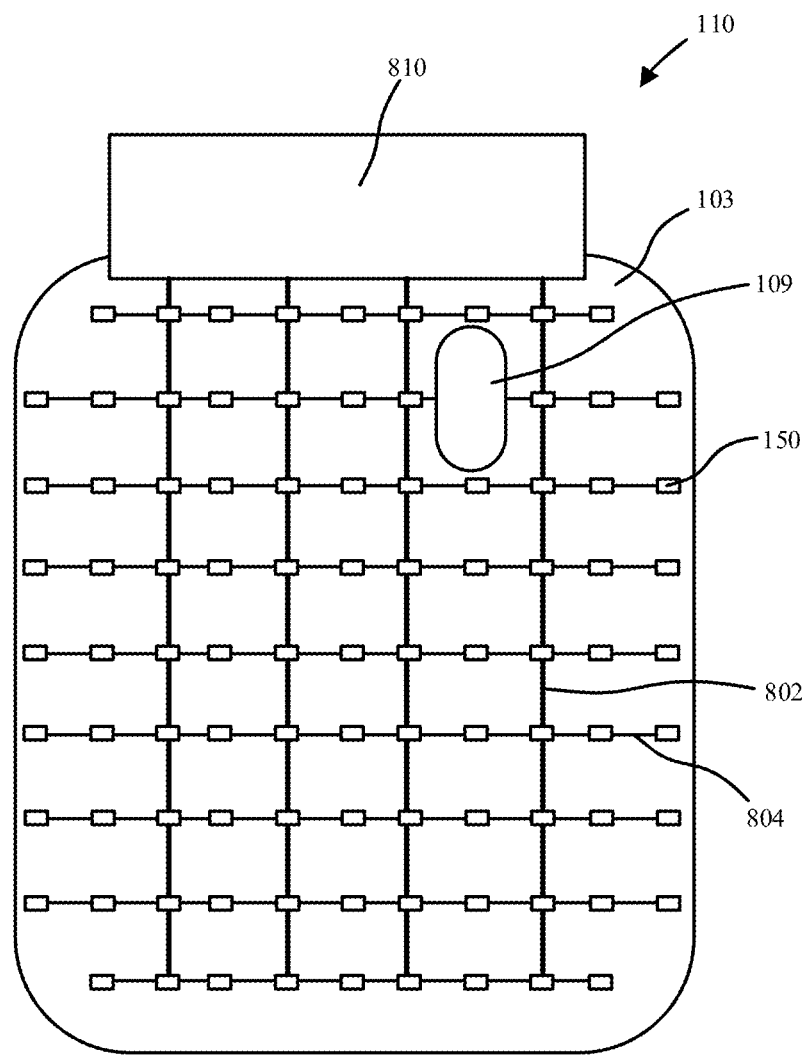
FIG. 8A is schematic top view illustration of a tile-based display panel with a cutout and spline-corners in accordance with an embodiment.
Figure 8B:
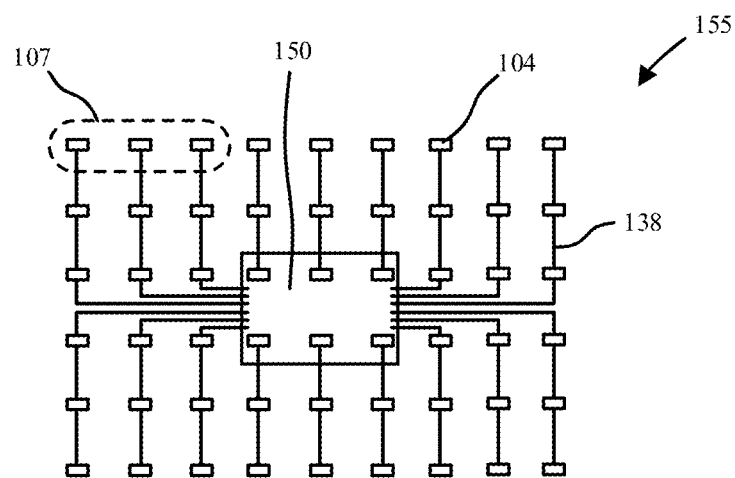
FIG. 8B is a schematic top view illustration of a matrix tile including a pixel driver chip to switch and drive multiple pixels of LEDs in accordance with an embodiment.

FIG. 8A is schematic top view illustration of a tile-based display panel 103 with a cutout 109 and spline-corners in accordance with an embodiment. For example, the spline-corners may be rounded edges including petals 106 folded into a curved 3D film contour. The tile-based display panels may include an arrangement of pixel driver chips 150 to drive local matrices of pixels. FIG. 8B is an example of a matrix tile 155 including a pixel driver chip 150 to switch and drive multiple pixels 107 of LEDs 104. This may include either a direct drive approach, where every pin of the pixel driver chip 150 is connected to one LED, or a local passive matrix (LPM) arrangement in which pins of the pixel driver chips 150 can be connected to strings of LEDs. In an embodiment, this may be an LPM tile 155. LPM arrangements in accordance with embodiments may significantly reduce the silicon area associated with the pixel drivers, and the peak panel current. In some embodiments the pixel driver chips are distributed between LEDs. Such a configuration may include pixel driver chips 150 being laterally between LEDs 104 on the same side of the display panel. Depending upon complexity, the pixel driver chips may be longer than the corresponding LED matrices they control (e.g. wider than row length of a corresponding matrix). As a result, the pixel driver chips may be staggered, for example, in zigzag patterned rows. It is not required that the pixel driver chips be mounted on the same surface as the LEDs, or between the LEDs. In accordance with all embodiments described herein the pixel driver chips 150 may also be located within the display panel, and may be positioned face up (e.g. with terminals facing up towards the LEDs 104), positioned face down (e.g. with terminals facing away from the LEDs), or both (with terminals on both top and bottom sides). Thus, where the pixel driver chips are described herein as being distributed about a display area, or interspersed with a display area, it is understood the pixel driver chips may be on the display substrate (e.g. surface mounted) or embedded within the display panel. In accordance with all embodiments described herein the pixel driver chips may be adjacent to a corresponding plurality of pixels. Likewise, this includes configurations of both pixel driver chips on or within the display panel.

In particular, the arrangement of pixel driver chips 150 in accordance with embodiments can remove the requirement for driver ledges on the edges of a display panel 103. As a result, the display panel 103 may have reduced borders, or zero borders outside of the display area. The configuration may facilitate the formation of display panels with curved edges, as well as internal cutouts 109. In addition, the configuration may facilitate modular arrangements, including micro arrangements, of display tiles. Generally, the control circuit 810 may be coupled to an edge of the display panel 103. Bus columns of global routing lines 802 may extend from the control circuit 810 to supply global signals to the display panel 103. For example, the global routing lines 802 may include at least data clock lines, emission clock lines, and vertical selection token (VST) lines. The global routing lines are coupled to a plurality of "hybrid" pixel driver chips, and together form a backbone of the display. The corresponding backbone hybrid pixel driver chips receive the global signals and then transmit manipulated signals to their corresponding rows of row lines 804 connected to the other pixel driver chips 150 within the same row. For example, the global data clock and emission clock signals may be converted to manipulated signals and transmitted to the row of pixel driver chips 150 along manipulated data clock lines and manipulated emission clock lines. For example, the manipulated signals may include only the necessary information for the particular row.

The tile-based display panels in accordance with embodiments may have various arrangements of display tiles. For example, the display tiles may be arranged side-by-side (horizontally), stacked (vertically), both, as well as other configurations. Additionally, the bus columns of global routing lines 802 may be aligned and connected for stacked display tiles.

Figure 9:
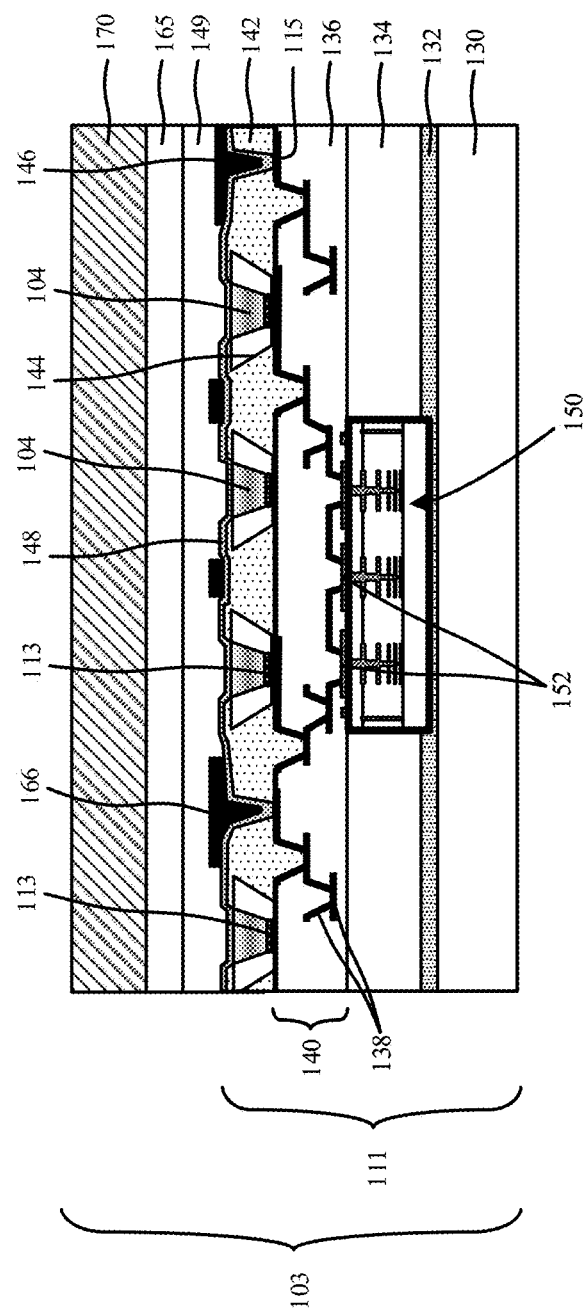
FIG. 9 is a close-up schematic cross-sectional side view illustration of a portion of display panel including embedded pixel driver chips in accordance with an embodiment.

FIG. 9 is a close-up schematic cross-sectional side view illustration of a portion of display panel 103 including embedded pixel driver chips 150 in accordance with an embodiment. Method of manufacture may include transferring an array of pixel driver chips 150 to a display substrate 130. For example, the display substrate 130 may be a flexible substrate, such as glass, polyimide, etc. An adhesion layer 132 may optionally be formed on the display substrate 130 to receive the pixel driver chips 150. Transfer may be accomplished using a pick and place tool. In an embodiment, a back side (non-functionalized) side is placed onto the adhesion layer 132, with the front side (active side, including contact pads 152) placed face up. The contact (terminal) pads 152 may be formed before or after transfer. As illustrated, a passivation layer 134 can be formed around the pixel driver chips 150, for example, to secure the pixel driver chips 150 to the display substrate 130, and to provide step coverage for additional routing. Suitable materials for passivation layer 134 include polymers, spin on glass, oxides, etc. In an embodiment, passivation layer is a thermoset material such as acrylic, epoxy, benzocyclobutene (BCB), etc.

A redistribution layer (RDL) 140 may then be formed over the array of pixel driver chips 150. The RDL 140 may, for example, fan out from the contact (terminal) pads 152 and additionally may include routing to/from control circuit 810. The RDL 140 may include one or more redistribution lines 138 and dielectric layers 136. For example, redistribution lines 138 may be metal lines (e.g. Cu, Al, etc.) and the dielectric layers 136 may be formed of suitable insulating materials including oxides (e.g. SiOx), nitrides, polymers, etc. In accordance with embodiments, RDL 140 includes one or more of the plurality global routing lines 802 and row lines 804 for signal and power (e.g. data signal, row synchronization signal, frame synchronization signal, and vertical synchronization token (VST), Vdd, etc.). RDL 140 additionally includes driver pads 113 for LEDs 104. In accordance with some embodiments, strings of LEDs may be connected to a corresponding interconnect (e.g. string, or line).

At this stage in the manufacturing process, the partially fabricated display panel 103 may be tested to determine operability of the pixel driver chips 150. For example, this may be done by probing the driver pads 113 or other test circuitry formed within the RDL 140. For example, the RDL 140 can include a test circuit with test pads at an edge of the display panel 103 which can be probed to test functionality of the pixel driver chips 150. This testing can be performed before or after transfer of the LEDs 104. In an embodiment, the test circuit can be removed from the edge of the display panel 103 after testing, for example during formation of the cutout patterns.

In the LED manufacturing process illustrated in FIG. 9, additional dielectric layers and routing layers may optionally be formed followed by the transfer and bonding of LEDs 104 onto the stack-up. In an embodiment, the LEDs 104 are optionally bonded inside bank structure openings 144 in a bank layer 142. The bank structure openings 144 may optionally be reflective, and may optionally be filled after bonding of the micro LEDs 104. The bank layer 142 may be further patterned to create openings 146 to expose a routing layer, such as (e.g. negative) voltage power supply lines 115, or cathodes. A top transparent or semi-transparent electrically conductive layer(s) 148 can then be deposited to provide electrical connection from the top sides of the LEDs 104 to the voltage power supply lines, or cathodes. Suitable materials include transparent conductive oxides (TCOs), conductive polymers, thin transparent metal layers, etc.

The illustrated stack-up through formation of the top transparent or semi-transparent electrically conductive layer(s) 148 may form the emissive stack 111, inclusive of the pixel driver chips 150 and LEDs 104. In accordance with some embodiments, the display panel 103 through (e.g. completely through) which the cutout 112 pattern is formed may include at least the emissive stack 111. The display panel 103 may optionally include additional layers through which the cutout 112 pattern is formed. For example, a black matrix layer 166 can be formed over the emissive stack 111. In accordance with embodiments, the black matrix layer 166 may reduce internal reflection (e.g. specular reflection) of the emissive stack 111, inclusive of reflection from the electrical routing and pixel driver chips 150. Increased area of the black matrix layer may correspond to a decrease in reflectivity of the emissive stack 111. The black matrix layer may be formed of suitable materials, such as polymer and glass and may include organic dye-based absorbers (including mixed molecule dyes) as well as pigment-based absorbers, or particles to absorb a specific visible wavelength spectrum. In an embodiment, the black matrix layer includes carbon-black particles. Furthermore, an overcoat layer 149 can be formed over the emissive stack 111. Overcoat layer 149 may be an optically clear material, such as an acrylate, silicone, etc., and may have a variety of functions, such as mechanical protection, levelling for bonding (e.g. with polarizer layer 170), and chemical passivation (e.g. from environment).

For example, a polarizer layer 170 may be applied to the emissive stack 111 with an optically clear adhesive layer 165 (e.g. acrylate, silicone-based, etc.), followed by cutting to form the cutout 112 pattern. As will become apparent in the following description, the display panel 103 may include a variety of layer stacks.

LED 104 and pixel driver chip 150 sizes in accordance with embodiments are scalable from macro to micro sized. In an embodiment, the pixel driver chips 150 may have a length with a maximum dimension of less than 400 µm, or even less than 200 µm. When surface mounted, the pixel driver chips 150 can have a further reduced x-y dimension of pixel pitch scale. Micro LEDs in accordance with embodiments may have a maximum dimension of less than 100 µm, or even less than 20 µm, such as less than 10 µm, or even less than 5 µm for displays with high resolution and pixel density.

Figure 10:
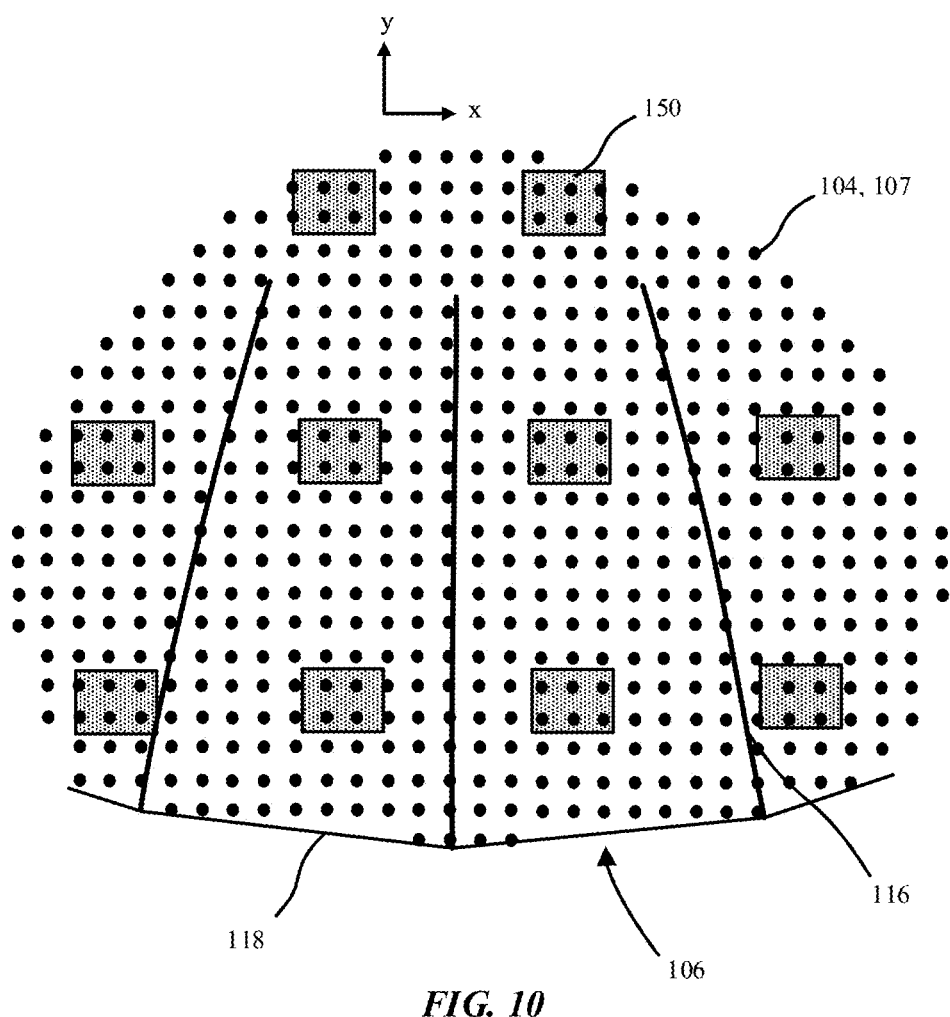
FIG. 10 is a schematic top view illustration of an array of LEDs or pixels and pixel driver chips superimposed onto a plurality of petals folded in a curved three-dimensional (3D) film contour in accordance with an embodiment.

Referring now to FIG. 10, a schematic top view illustration is provided of an array of LEDs 104 or pixels 107 and pixel driver chips 150 superimposed onto a plurality of petals 106 folded in a curved three-dimensional (3D) film contour. In particular, FIG. 10 illustrates several specific obstacles to be overcome when forming the cutout pattern. Specifically, the cutout pattern may form trenches 116 through groups of LEDs 104 or pixels, rendering certain LEDs or pixels inoperable. Similarly, pixel driver chips 150 may need to be avoided when designing the cutout pattern. Furthermore, the cutout patterns may not align with the pixel grids, and as the cutout patterns (trenches) become wider (for example, necessitated to accommodate a specified curvature) pixel grid misalignment between adjacent petals can occur when folding.

The cutouts in accordance with embodiments can be provided by cutting techniques, such as laser cutting, or alternatively be pre-patterned. The particular cutting technique may be selected based on street width and height of the LED and pixel arrangements. In an embodiment cutting is performed with a femtosecond laser to achieve a narrow spot (cut) size or width. The cut and folded display structures and techniques may be particularly applicable for micro LED displays due to small LED size, and also stability of the inorganic semiconductor-based micro LEDs, which are less susceptible to degradation due to exposure to environment than OLEDs.

Figure 11:
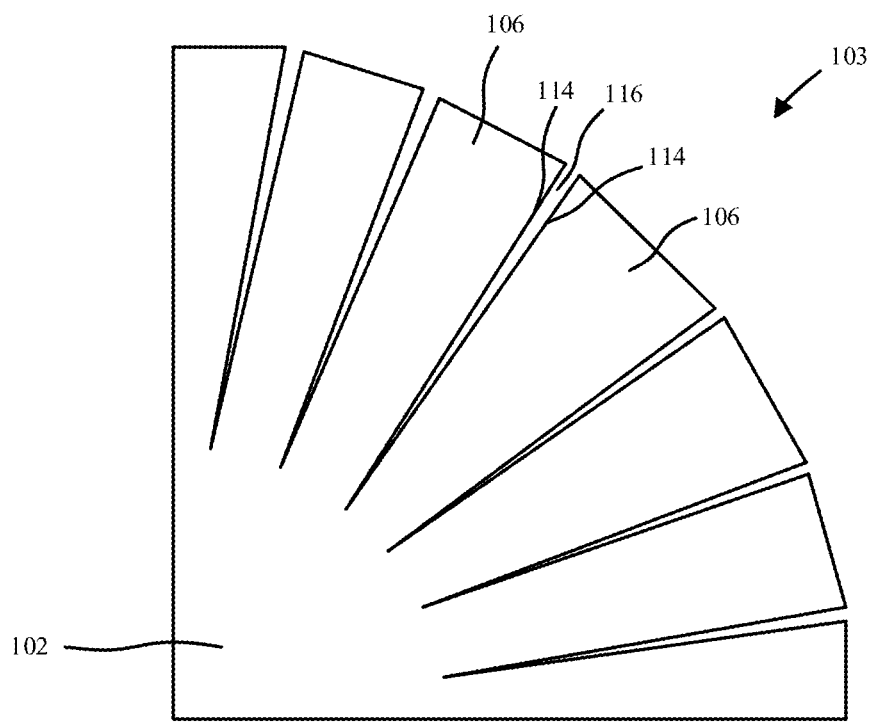
FIG. 11 is a schematic top view illustration of a straight-line cutout pattern formed in a corner of a display panel in accordance with an embodiment.
Figure 12:
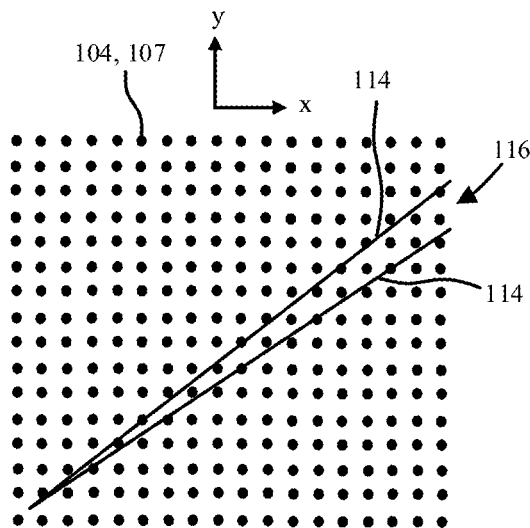
FIG. 12 is a close-up illustration of a straight-line cutout pattern through a matrix of LEDs in a grid pattern in accordance with an embodiment.
Figure 13:
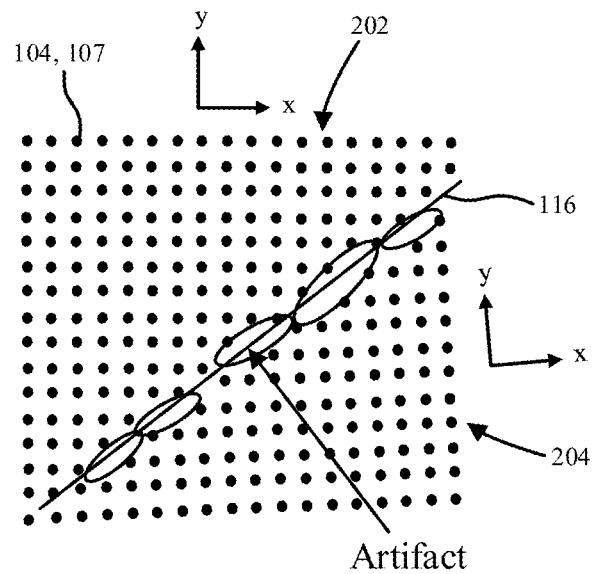
FIG. 13 is a close-up illustration of folded display panel with a straight-line cutout pattern through a matrix of LEDs in a grid pattern in accordance with an embodiment.

Referring now to FIG. 11 a schematic top view illustration is provided of a straight-line cutout pattern formed in a corner of a display panel in accordance with an embodiment. As shown, the edges 114 of petals 106 are straight lines, and trench 116 width may increase with distance along the flat display panel 103 prior to folding. Increased width may accommodate folding at a larger radius. FIG. 12 is a close-up illustration of such a straight-line cutout pattern through a matrix of LEDs 104 or pixels 107 in a grid pattern prior to folding. FIG. 13 is a close-up illustration of the display panel with a straight-line cutout pattern after folding.

In an embodiment, a display structure includes a display panel 103 that includes pixel circuitry (e.g. pixel driver chips 150, RDL 140, etc.) connected to a matrix of LEDs 104 within a display area 105 of the display panel 103. The display area 105 includes a main body area 102 (e.g. this may be flat or curved) and a plurality of petals 106 extending from the main body area 102. A cutout exists in the display panel 103 that defines a first edge 114 of a first petal 106 of the plurality of petals and a second edge 114 of a second petal 106 of the plurality of petals, with a trench 116 between the first and second edges 114. In accordance with embodiments the petals 106 are folded into a curved 3D film contour, with the trench 116 located between the first and second petals 106 within the curved 3D film contour.

The first petal can include a first array of LEDs 104 (as well as pixels 107) positioned in a first grid 202 with a first repeating x-y pixel pitch, and the second petal includes a second array of LEDs 104 (as well as pixels 107) positioned in a second grid 204 of a second repeating x-y pixel pitch. As shown in FIG. 13, the first grid 202 may be offset with the second grid 204, though the x-y pixel pitch for both the first and second grids 202, 204 is the same. While the first and second grids 202, 204 may have the same orientation before folding (e.g. see FIG. 12), the first and second grids 202, 204 may be off-set as a result of folding (e.g. see FIG. 13). Still referring to FIGS. 12-13 a consequence of straight-line cutout patterns is that the cuts may not necessarily be aligned with the arrays of LEDs/pixels or grids. As a result, cutting can result in dead pixels, as well as irregular LED/pixel spacing across the cut lines or trenches 116 after folding, which can potentially result in optical artifacts along the trenches 116 between adjacent petals 106. The trenches 116 between folded petals 106 are also described herein as seams between petals. The various cutting patterns, and pixel and matrix tile arrangements described herein may be designed to further mask or hide optical artifacts that may result from folding of geometrical patterns into compound 3D film contours. Furthermore, seam hiding techniques may additionally incorporate filling the trenches 116 with various materials, deposition of materials or layers adjacent to the trenches, and various polarization layer structures. Thus, the final display structures may include combinations of various embodiments described herein to achieve a requisite compound 3D film contour, mitigation of optical artifacts, and seam hiding.

Figure 14:
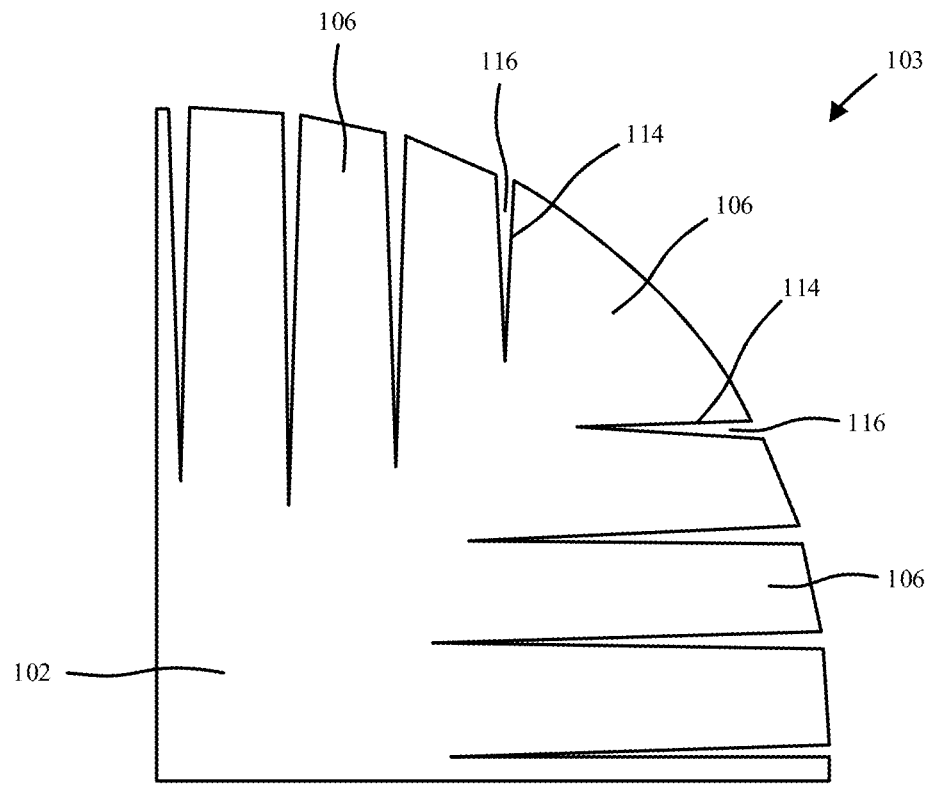
FIG. 14 is a schematic top view illustration of a cutout pattern with orthogonal straight cuts formed in a corner of a display panel in accordance with an embodiment.
Figure 15:
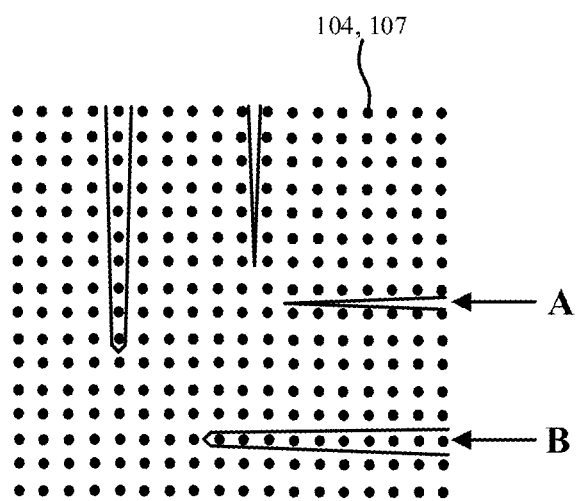
FIG. 15 is a close-up illustration of a cutout pattern with orthogonal straight cuts through a matrix of LEDs in a grid pattern in accordance with an embodiment.

Referring now to FIGS. 14-15, a variation of the straight cutout pattern is illustrated with orthogonal straight cuts in a corner of a display panel. The trenches 116 or cutouts can be made between row or columns of LEDs 104 or pixels 107 as shown in region A, or may even remove one or more rows or columns of LEDs 104 or pixels 107 as shown in region B. Such an arrangement may facilitate more consistent cutting along matrix tile (e.g. see FIG. 8B) edges.

In an embodiment, a display structure includes a first plurality of first cutouts through the display panel 103 and a corresponding first plurality of first trenches 116, and a second plurality of second cutouts through the display panel 103 and a corresponding plurality of second trenches 116, where the first plurality of first trenches 116 is substantially orthogonal to the second plurality of second trenches 116. In accordance with embodiments, the first plurality of first trenches 116 is substantially orthogonal to the second plurality of second trenches 116 about a corner of the curved three-dimensional (3D) film contour. In the illustrated embodiment, a line of LED subpixels (or pixels) terminates at a corner of a cutout pattern. See for example the column of LEDs 104 (or pixels 107) cutout at region B.

Figure 16:
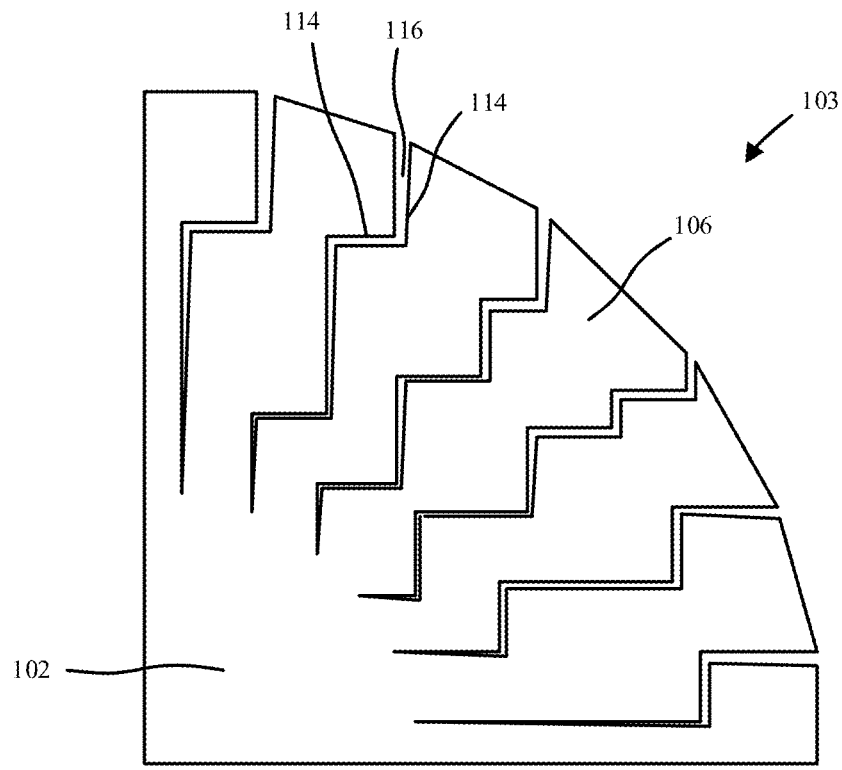
FIG. 16 is a schematic top view illustration of a zigzag cutout pattern formed in a corner of a display panel in accordance with an embodiment.
Figure 17:
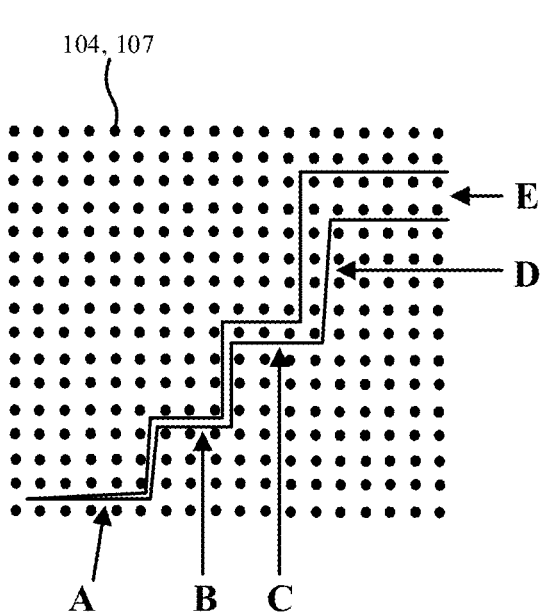
FIG. 17 is a close-up illustration of a zigzag cutout pattern through a matrix of LEDs in a grid pattern in accordance with an embodiment.
Figure 18:
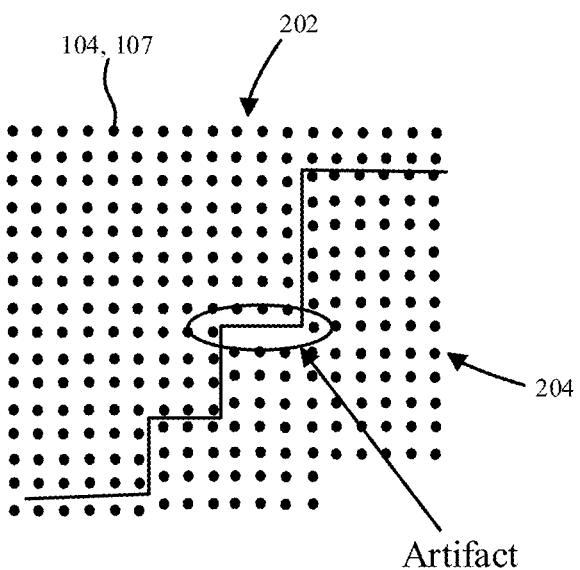
FIG. 18 is a close-up illustration of folded display panel with a zigzag cutout pattern through a matrix of LEDs in a grid pattern in accordance with an embodiment.

Another variation is illustrated in FIGS. 16-18, where a zigzag cutout pattern is formed along an edge of a display panel 103. Similar to FIGS. 11-13, FIGS. 16-18 illustrate schematic top views of a display panel before folding (FIGS. 16-17) and after folding the display panel into a curved 3D film contour (FIG. 18). Similar to the orthogonal cut designs, the zigzag pattern can mitigate cutting through LEDs 104 and pixels 107 by aligning the cutout pattern (and trenches 116) with the pixel grids. Such an arrangement may also facilitate more consistent cutting along matrix tile (e.g. see FIG. 8B) edges. Nevertheless, similar to the other embodiments, optical artifacts may still appear as the cutting lines (trench 116 widths) are widened to accommodate folding over a certain degree, or radius.

Referring to FIG. 17, the zigzag cutout pattern may incorporate a combination of various arrangements, such as increasing width (or decreasing width after folding in FIG. 18) between rows or columns of LEDs 104 (or pixels 107) as shown in region A, or constant width as shown in region B. Region C shows a constant width where a string of LEDs 104 (or pixels) is cutout, with constant width between adjacent LEDs 104 (or pixels) on opposite sides of the trench 116, or an increasing width (or decreasing width in FIG. 18) between rows or columns of LEDs 104 (or pixels 107) on opposite sides of cutout LEDs or pixels. Additionally, the cutout width can be increased as shown in region E to remove multiple strings of LEDs or pixels.

Similar to a straight cutout pattern, the first and second grids 202, 204 with the zigzag cutout pattern may have the same orientation before folding (e.g. see FIG. 17) and be offset as a result of folding (e.g. see FIG. 18). In the illustrated embodiment, a line of LED subpixels (or pixels) terminates at a corner of the zigzag pattern. See for example the column of LEDs 104 (or pixels 107) cutout at region D.

Figure 19:
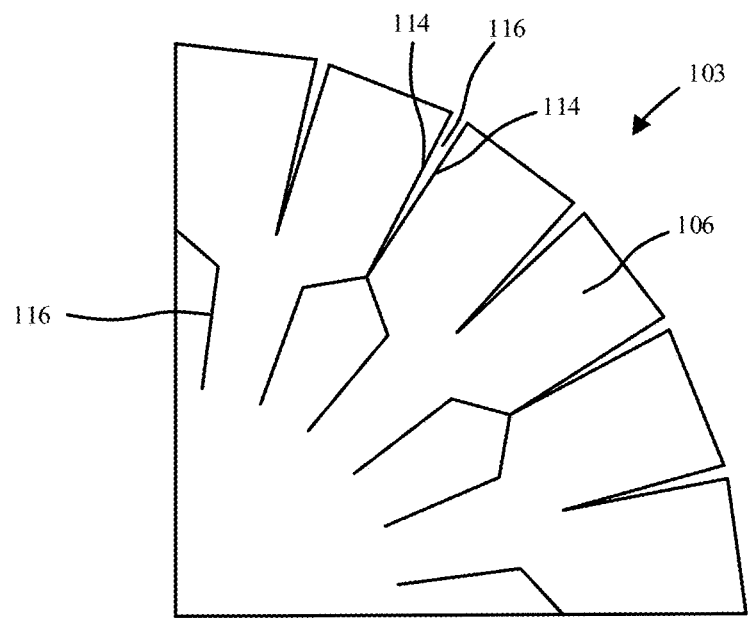
FIG. 19 is a schematic top view illustration of a cutout pattern with merged trenches in accordance with an embodiment.
Figure 20:
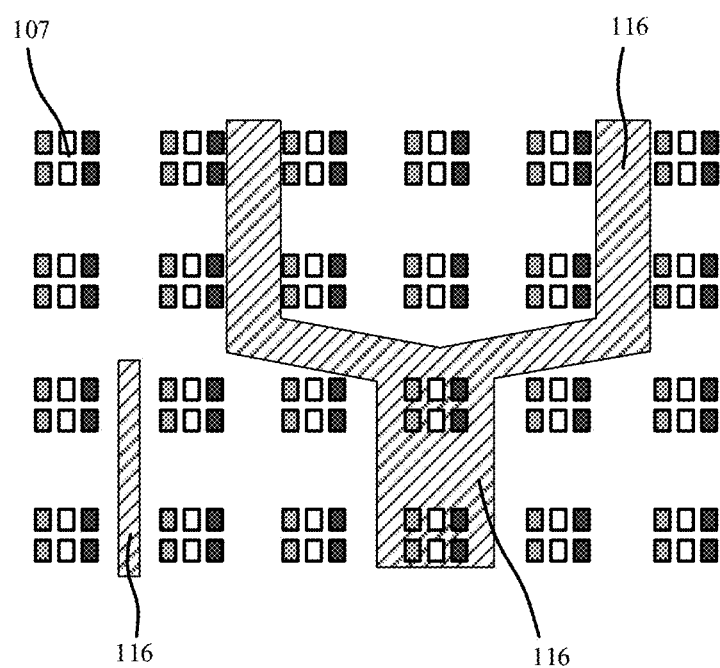
FIG. 20 is a close-up schematic top view illustration of a cutout pattern with merged trenches through an array of pixels in accordance with an embodiment.

Another variation is illustrated in FIGS. 19-20 in which a cutout pattern includes merged trenches, which can be formed through an array of LEDs or pixels in accordance with embodiments. Such an embodiment may merge two trenches 116 together to create a 2× trench width (pre-folding). As previously described, the cutout widths for trenches 116 may need to increase to accommodate bending or folding over a certain angle or radius of curvature, which in turn can cause misalignment of pixel grids in adjacent petals 106. By combining adjacent cutout trenches 116 to a single cutout trench 116 the width can be increased, while at the same time maintaining pixel grid alignment, and mitigating optical artifacts in the folded display panel. In the exemplary embodiment illustrated in FIG. 20, trenches 116 can be formed between LEDs or pixels 107, and then merged together to remove a string of LEDs or pixels 107.

Figure 21:
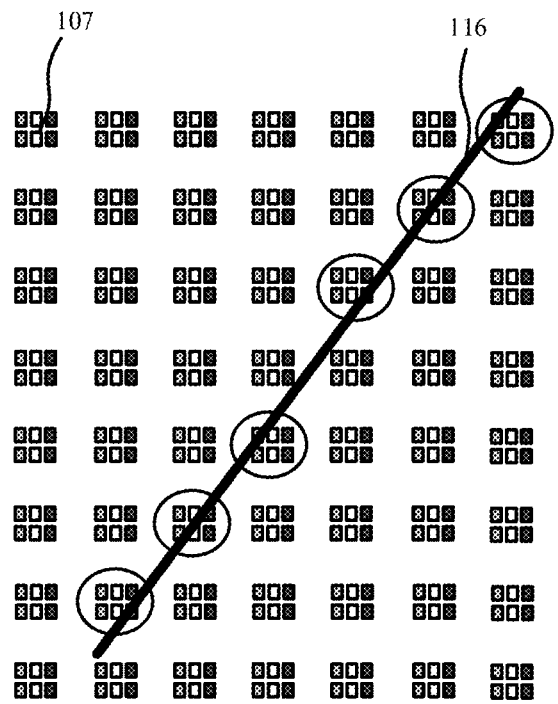
FIG. 21 is a close-up illustration of a straight-line cutout pattern through a matrix of pixels in accordance with an embodiment.
Figure 22:
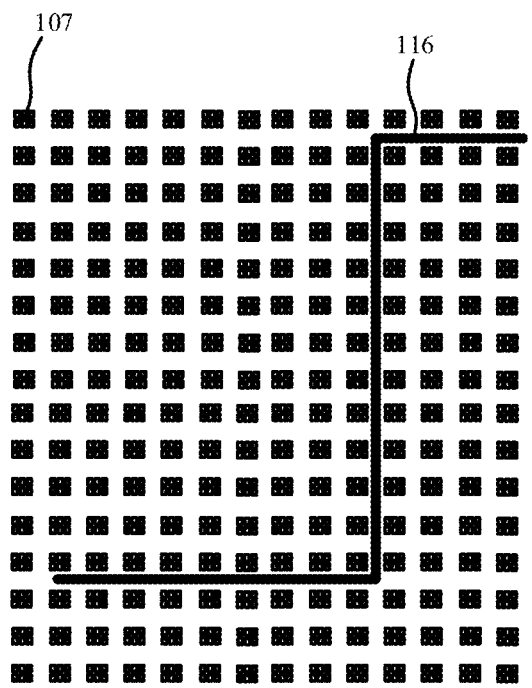
FIG. 22 is a close-up illustration of a zigzag cutout pattern through a matrix of pixels in accordance with an embodiment.

Up until this point, various cutout patterns have been described and illustrated (e.g. straight, orthogonal, zigzag, merged) as being equally applicable for both LEDs 104 and pixels 107. Pixels 107 will be formed of multiple subpixels of LEDs 104 designed for different color emission (e.g. red, blue, green, etc.). Pixels 107 may also include an arrangement of primary and redundant LED pairs. The preceding discussion has also been made without reference to pixel density, or pixels per inch (PPI). Referring now to FIGS. 21-22 exemplary close-up illustrations are provided of straight-line and zigzag cutout patterns through a matrix of pixels. In the illustrated embodiments cutout pattern trench 116 width is uniform. As shown, an angular cutout pattern through a grid of pixels 107 may run though several pixels 107, which can result in either dead or partially dead pixels 107, which can produce a variety of artifacts. A zigzag pattern, of same cutout width, can run between pixels 107 with less damage and resultant artifacts. As a result, a zigzag pattern may additionally be utilized for higher resolution applications, with higher pixel density. Zigzag cutout patterns may require more complicated and accurate cutting and folding processes.

Figure 23A:
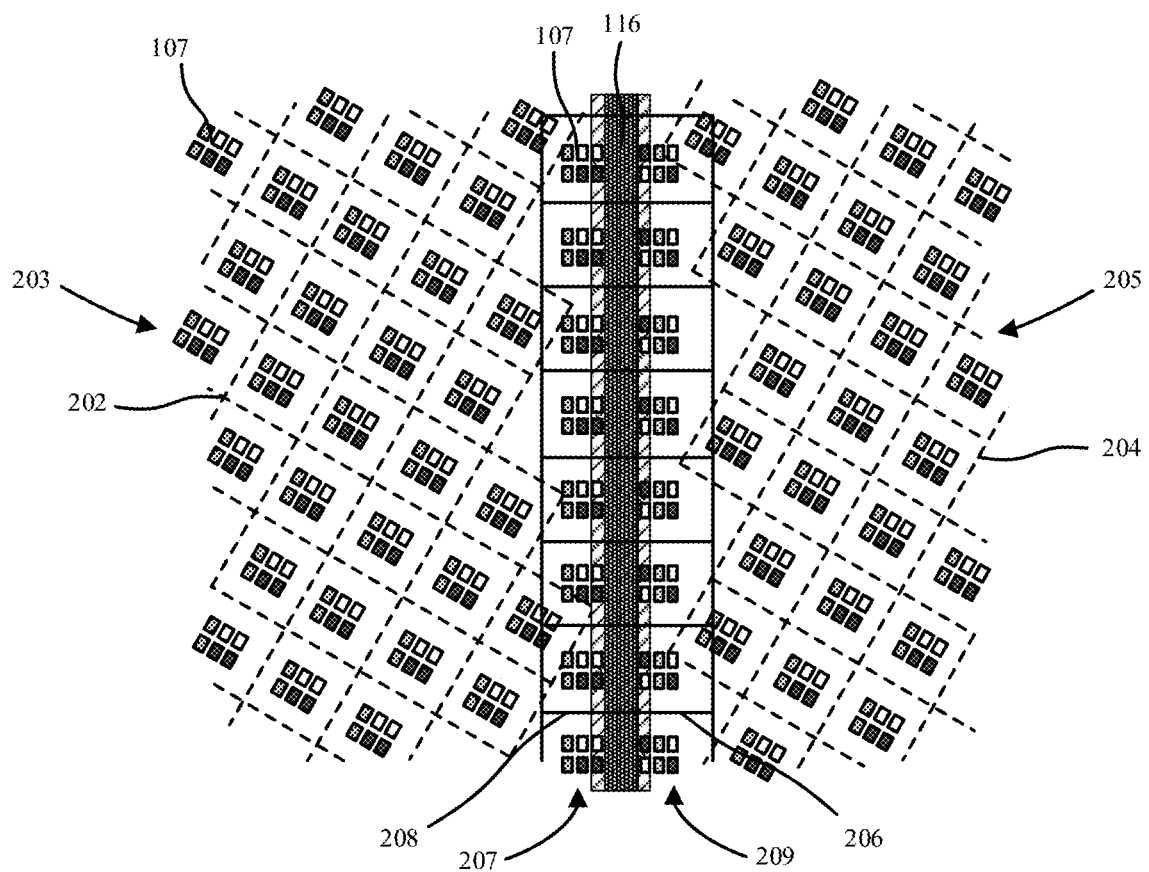
FIG. 23A is a close-up illustration of a straight-line cutout pattern through an off-grid arrangement of pixels in accordance with an embodiment.
Figure 23B:
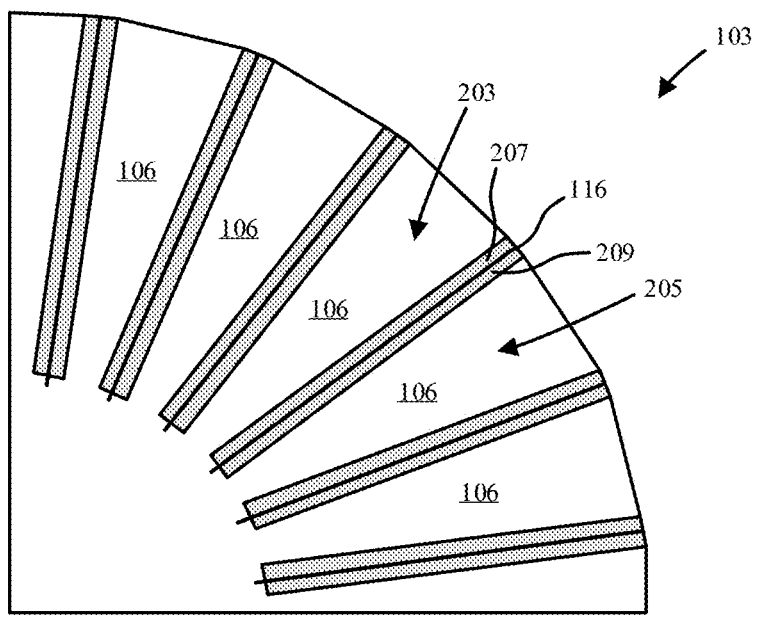
FIG. 23B is a schematic top view illustration of a plurality of petals including off-grid arrangement of pixels adjacent the trenches in accordance with an embodiment.

Referring now to FIG. 23A a close-up illustration is provided of a straight-line cutout pattern through an off-grid arrangement of pixels 107. Such an arrangement may additionally be compatible with more complex cutout patterns, including zigzag, merged, etc. It is to be appreciated that while an arrangement of pixels 107 is illustrated, the illustrated embodiment may also be compatible with a similar arrangement of LEDs 104 in place of the pixels 107. Generally, the embodiment illustrated in FIG. 23A may be achieved by transferring arrays of LEDs 104 from different donor substrates, and possibly with different transfer head arrays. As shown, the display structure can include a first petal 106 with a first array 203 of LEDs 104 positioned in a first grid 202 with a first repeating x-y pixel pitch, and a second petal 106 with a second array 205 of LEDs positioned in a second grid 204 with a second repeating x-y pixel pitch that matches the first repeating x-y pixel pitch. The first petal 106 can additionally include a third array 207 of LEDs aligned adjacent to the trench 116, while the second petal 106 includes a fourth array 209 of LEDs aligned adjacent to the trench 116. In the illustrated embodiment, the third array 207 of LEDs is arranged in a third pattern 206 (e.g. line, grid, etc.) that is off-grid from the first grid 202, and the fourth array 209 of LEDs is arranged in a fourth pattern 208 (e.g. line, grid, etc.) that is off-grid from the second grid 204. In this arrangement, the off-grid third and fourth patterns 206, 208 can compensate for, or mitigate, optical artifacts that may otherwise be more pronounced. FIG. 23B is a schematic top view illustration of an exemplary application of the pixel pattern of FIG. 23A in accordance with an embodiment prior to folding. As shown, the first and second arrays 203, 205 of LEDs may be those of the main body area 102.

The pixels 107 may additionally have specific arrangement to accommodate cutout patterns. In the particular embodiments illustrated in FIGS. 24A-24D, each pixel includes a red (R), blue (B), and green (G) emitting LEDs, and each emission color may include a primary (p) or redundant (r) LED. The particular arrangements illustrated in FIGS. 24 24A-24D are specific to a total of six LEDs (3 primary, 3 redundant) in an RGB pixel arrangement, though embodiments are not so limited, and may include different emission colors and numbers of LEDs for the same emission color, and different redundancies.

Figure 24C:
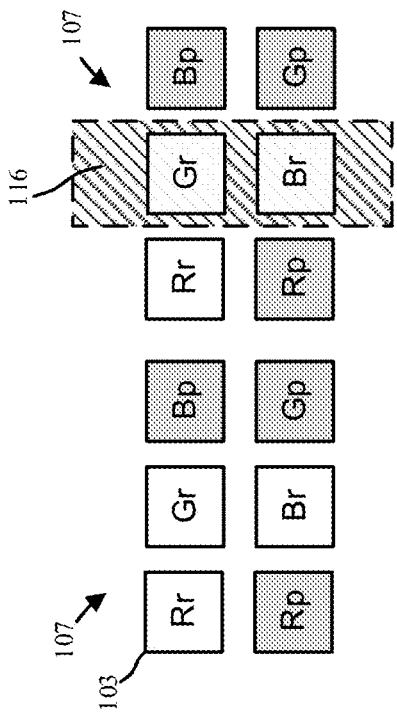
FIG. 24C is a schematic top view illustration of a trench formed through redundant LEDs within a pixel in accordance with an embodiment.
Figure 24D:
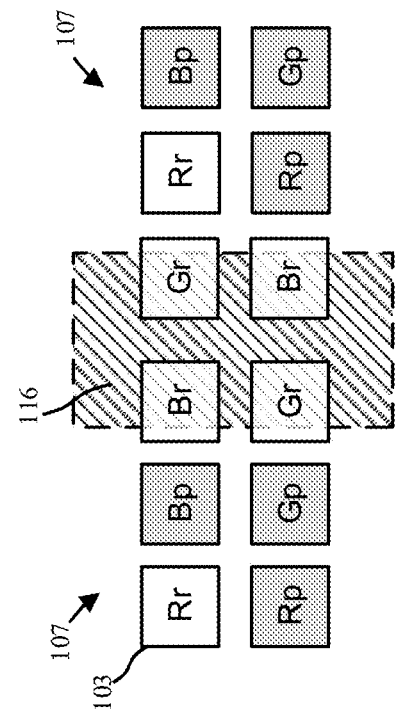
FIG. 24D is a schematic top view illustration of a trench formed through a pair of pixels with redundant LEDs nearest the trench in accordance with an embodiment.
Figure 24A:
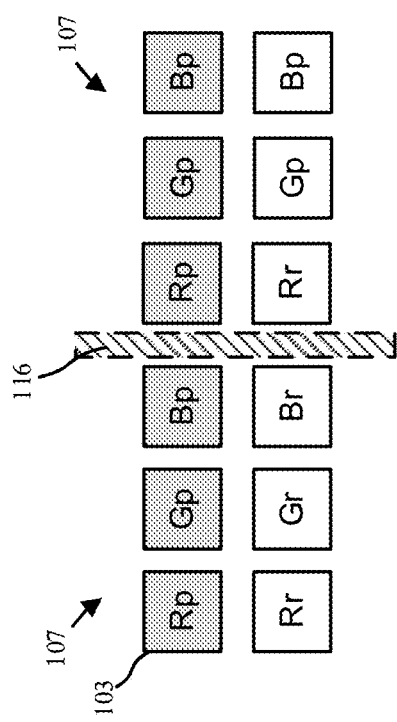
FIG. 24A is a schematic top view illustration of a trench formed between a pair of pixels including rows of primary LEDs and redundant LEDs in accordance with an embodiment.
Figure 24B:
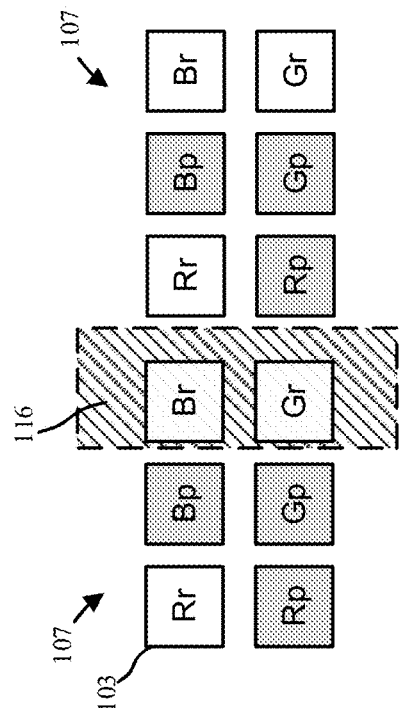
FIG. 24B is a schematic top view illustration of a trench formed between a pair of pixels with redundant LEDs for one pixel nearest the trench in accordance with an embodiment.

FIG. 24A is a schematic top view illustration of a trench 116 formed between a pair of pixels 107 including rows of primary (p) LEDs and redundant (r) LEDs in accordance with an embodiment. FIG. 24B is a schematic top view illustration of a trench 116 formed between a pair of pixels 107 with redundant LEDs (e.g. Br, Gr) for one pixel nearest the trench in accordance with an embodiment. In this manner, the trench 116 width may optionally cut through a column of redundant LEDs without affecting operability of the display panel, assuming the redundant LEDs are not needed for operation. FIG. 24C is a schematic top view illustration of a trench 116 formed through redundant LEDs (e.g. Gr, Br) within a pixel 107 in accordance with an embodiment. In this manner, the trench 116 width may optionally cut through a column of redundant LEDs without affecting operability of the display panel, assuming the redundant LEDs are not needed for operation.

FIG. 24D is a schematic top view illustration of a trench 116 formed through a pair of pixels 107 with redundant LEDs nearest the trench 116 in accordance with an embodiment. In the particular embodiment illustrated, the primary LEDs are all grouped in the two columns furthest from the cutout pattern, or trench 116. Thus, two of the three redundant LEDs are in the column closest to the cutout pattern, or trench 116. In this manner, the trench 116 width may optionally cut through a column of redundant LEDs without affecting operability of the display panel, assuming the redundant LEDs are not needed for operation. In an embodiment, the pairs of pixels 107 on opposite sides of the trench 116 can be mirror images of each other, though this is not required, as illustrated. It is to be appreciated that while trenches 116 are illustrated as running through columns of redundant LEDs in FIGS. 24B-24D, this is for illustrational purposes and is not required. Furthermore, while illustrated columns-wise, similar arrangements can be implemented row-wise.

Figure 25:
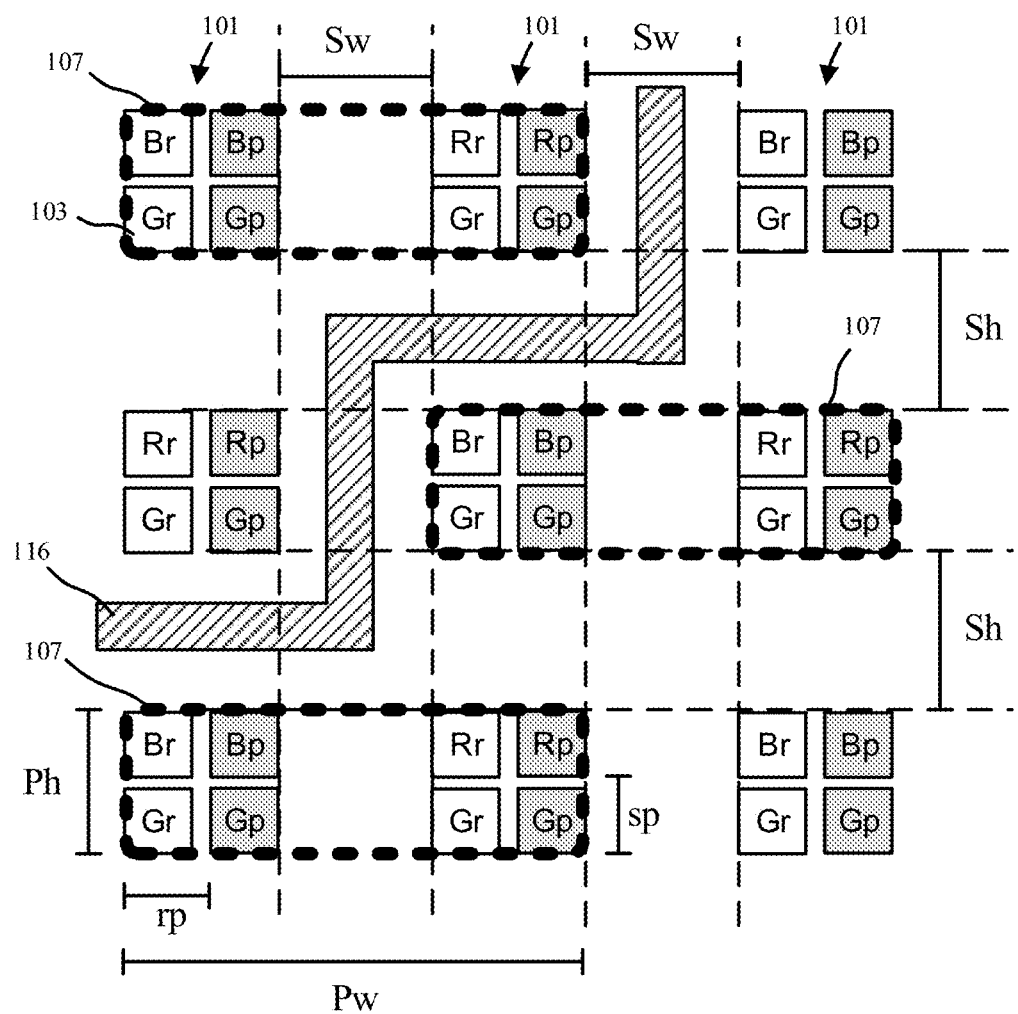
FIG. 25 is a schematic top view illustration of a pixel array with clustered subpixels in accordance with an embodiment.

An alternative pixel arrangement is illustrated in FIG. 25 in which the pixel array includes subpixel clusters 101 in accordance with an embodiment. As shown, each subpixel includes a pair of LEDs, including a primary (p) LED and redundant (r) LED. Rather than clustering of pixels, the subpixels for adjacent pixels can be clustered together. Such an arrangement can increase street width (Sw) and street height (Sh) between columns and rows of pixels 107 to accommodate larger trench 116 widths for both straight, zigzag and other cutout patterns. In the particular embodiment illustrated subpixel pitch (sp) between different colored subpixels is approximately the same as redundant LED pitch (rp) within a same subpixel. As shown, the clustered subpixels results in a larger pixel width (Pw) than the street widths (Sw) or street heights (Sh). The pixel width (Pw) illustrated includes a street width (Sw) running through the pixel 107 between the subpixel clusters 101. A street width (Sw) also runs between adjacent pixels 107. Functional street width (Sw) can also be increased between pixels 107 due to a redundant column of LEDs 104 (for all pixel colors) running along an edge of the pixel width (Pw). Similar to FIGS. 24B-D, this redundant column of LEDs 104 can be cut out if needed to increase trench 116 width, and functional street width (Sw).

Pixel height (Ph) may be limited to a subpixel cluster 101 height, and does not include a street height (Sh). Thus, pixel height (Ph) may be less than pixel width (Pw). In the particular embodiment illustrated a green emitting LED pair is provided with each subpixel cluster 101, either with a red emitting LED pair or blue emitting LED pair, though other arrangements are possible. Furthermore, the pixel 107 pattern may be a diamond pattern, with repeating subpixel clusters 101 in a diamond pattern. In an embodiment, street width (Sw) is the same for the pixels on opposite sides of a street, as for the same street running between subpixels clusters 101 within a pixel 107.

In an embodiment, a display structure includes an array of pixels 107, with each pixel including a first subpixel cluster including a pair of first color emitting LEDs (e.g. Br, Bp) and a pair of second color emitting LEDs (e.g. Gr, Gp), and a second subpixel cluster including a pair of third color emitting LEDs (e.g. Rr, Rp) and a second pair of the second color emitting LEDs (e.g. Gr, Gp). A street width (Sw) between the first subpixel cluster and the second subpixel cluster is greater than pitches (e.g. sp, rp) between the pairs of LEDs within each first and second subpixel clusters.

Still referring to FIG. 25, the array of pixels 107 can be arranged in a repeating array with a first subpixel cluster (e.g. Br, Bp, Gr, Gp) of a first subpixel arranged over a second subpixel cluster (e.g. Rr, Rp, Gr, Gp) of a second subpixel, and a second subpixel cluster (e.g. Rr, Rp, Gr, Gp) of the first subpixel arranged over a first subpixel cluster (e.g. Br, Bp, Gr, Gp) of the second subpixel. A cutout pattern, or trench 116, can extend along a street width (Sw) between the first subpixel cluster and a second subpixel cluster. A cutout pattern, or trench 116, can also, or alternatively extend though a street height (Sh) between a first pixel 107 over a second pixel 107.

Up until this point the discussion has largely focused on forming the cutout patterns and trenches 116 through LED 104 and pixel 107 arrays and grids. However, the display panel 103 may additionally be designed to accommodate cutout patterns through routing layers and working circuitry for the LEDs and pixels. In particular, the display panel 103 may be designed to accommodate cutting through the matrix tiles 155 so as to not cause optical artifacts due to entire pixel arrays being inoperable due to degradation of the working circuitry as a result of the cutout process.

FIG. 26A is a schematic top view illustration of a straight-line cutout pattern over a regular array of matrix tiles 155 in accordance with an embodiment. Similar to obstacles with LEDs and pixels, the straight-line cutout pattern of FIG. 26A may result in cutting through the pixel driver chips 150 as well as the working circuity to the pixel driver chips and from the pixel driver chips to the LEDs. In an embodiment, routing within the display panel 103, such as within RDL 140 can be re-routed to accommodate such a straight-line cutout pattern. The pixel driver chips 150 can also be relocated (off-grid) within the petals 106 to avoid being cut and accommodate re-routing. Referring now to FIG. 26B, such re-routing complexities may be reduced with an arrangement of orthogonal cutouts between matrix tiles 155.

In such an arrangement the regular arrays, or grids of LEDs, pixels, and pixel driver chips 150 can be largely maintained. Nevertheless, some amount of re-routing may be needed around the trenches. Similarly, re-routing complexities can be reduced with a zigzag cutout pattern as illustrated in FIG. 27, while largely maintaining the regular arrays, or girds of LEDs, pixels and pixel driver chips.

Figure 28A:
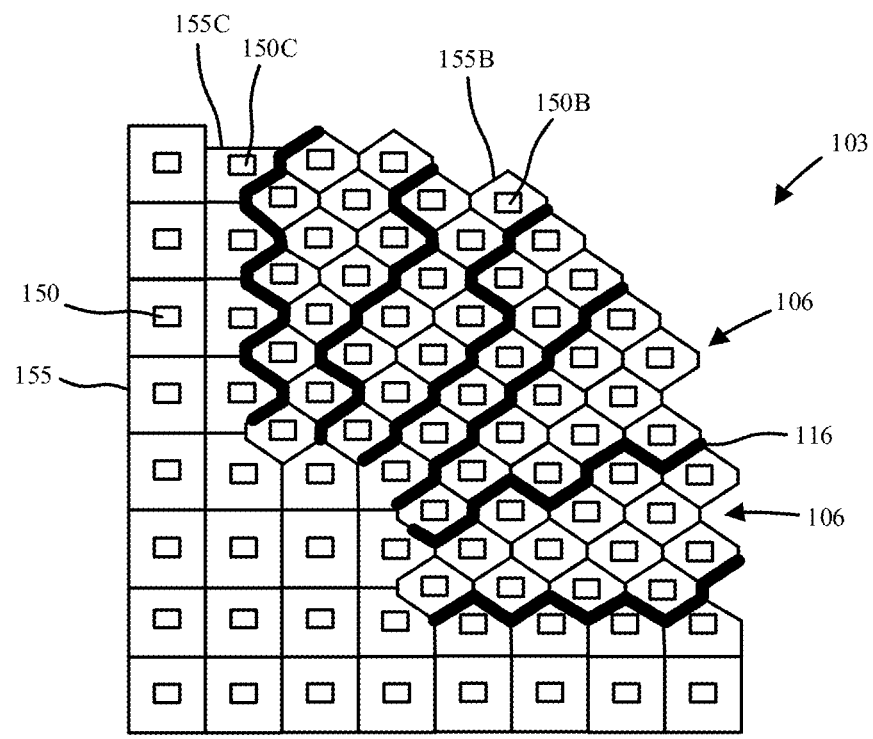
FIG. 28A is a schematic top view illustrate of a zigzag cutout pattern through a grid corner matrix tiles and pixel driver chips with different x-y pitch than that of the pixel driver chips and matrix tiles in a main body of the display panel in accordance with an embodiment.
Figure 28B:
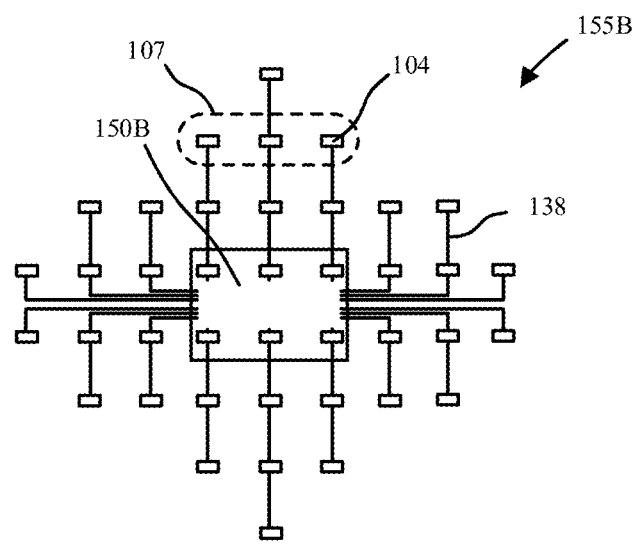
FIG. 28B is a schematic top view illustration of a corner matrix tile including a pixel driver chip to switch and drive multiple pixels of LEDs in accordance with an embodiment.

FIG. 28A is a schematic top view illustration of a zigzag cutout pattern through a grid of corner matrix tiles 155B and pixel driver chips 150B with different x-y pitch than that of the pixel driver chips 150 and matrix tiles 155 in a main body of the display panel in accordance with an embodiment. FIG. 28B is a schematic top view illustration of a corner matrix tile 155B including a pixel driver chip 150B to switch and drive multiple pixels of LEDs in accordance with an embodiment. As shown, the cutout pattern and trenches 116 are made along the matrix tile 155B edges.

Such a configuration allows for a more uniform, regular pixel array and distribution of pixel driver chips 150B. As such the petals 106 are composed of the corner matrix tiles 155B. Such a corner matrix tile 155B arrangement may further reduce re-routing complexities with matrix tile 155B repetition.

In accordance with the embodiments of FIGS. 26A-28B, a display panel 103 can include a first array of pixel driver chips 150 coupled to a first subgroup of LEDs 104 in the matrix of LEDs in the main body area 102 of the display area. A second array of second pixel driver chips 150, 150B is coupled to a second subgroup of LEDs in matrix of LEDs 104 in the plurality of petals 106 of the display area.

In an embodiment, the first array of pixel driver chips 150 is positioned in a first grid with a repeating x-y pixel pitch, and the second array of pixel driver chips 150B is positioned in a second grid of a second repeating x-y pixel driver chip that is smaller than the first repeating x-y pixel driver pitch. For example, the tiles 155 within the petals 106 for any cutout pattern can be resized or reshaped to accommodate the cutout patterns and re-routing.

The display panel 103 can include a first array of first matrix tiles 155 in the main body area 102 or the display area, and a second array of second matrix tiles 155, 155B in the plurality of petals 106 of the display area. In an embodiment, each first matrix tile 155 includes a first pixel driver chip 150 coupled to a first matrix tile group of LEDs 104 arranged in a first pattern. For example, FIG. 8B illustrates an exemplary first pattern (e.g. rectangle). In an embodiment, each second matrix tile 155B includes a second pixel driver chip 150B coupled to a second matrix tile group of LEDs 104 arranged in a second pattern different from the first pattern. For example, FIG. 28B illustrates an exemplary second pattern (e.g. hexagon). In an embodiment the LEDs 104 and pixels 107 within the first and second patterns may have the same x-y pitch. Thus, the differences in the first and second patterns may be tile shape and orientation connected to the pixel driver chips 150, 150B rather than the fine grain LED grid patterns. While square and hexagon patterns are illustrated, these are understood to be exemplary, and embodiments are not so limited, and may include other patterns including octagon, other polygons, and combinations of polygons.

Transition between different tile patterns in accordance with embodiments may be accomplished with intermediate matrix tiles. For example, as shown in FIG. 28A an intermediate matrix tile 155C may include an intermediate pixel driver chip 150C coupled to an intermediate tile group of LEDs 104 arranged in an intermediate pattern that is a portion of the first pattern of the first matrix of tiles 155.

The display panels in accordance with embodiments may include a general routing pattern in the main body area 102 of the display area 105. This may include local matrix routing between the pixel driver chips 150 and LEDs 104. Such local matrix routing may be confined to repeating tiles 155. The general routing pattern may additionally include global routing paths, such as global routing lines 802 and row lines 804 (e.g. data signal, row synchronization signal, frame synchronization signal, and vertical synchronization token (VST), Vdd, etc.). Such global routing paths may connect strings of pixel driver chips 150 to the control circuit 810, for example.

Figure 29A:
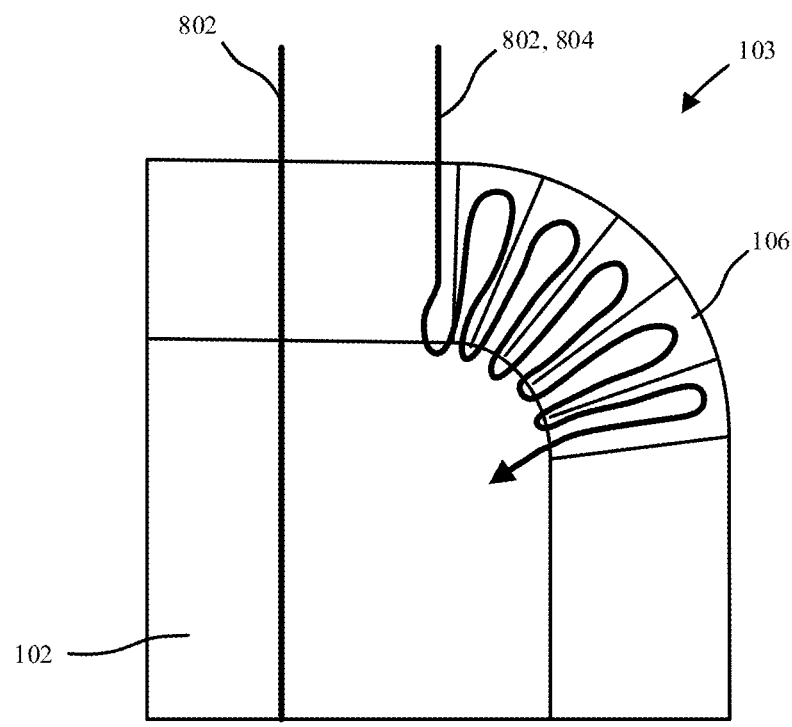
FIG. 29A is a schematic top view illustration of global routing path running through a plurality of petals in accordance with an embodiment.
Figure 29B:
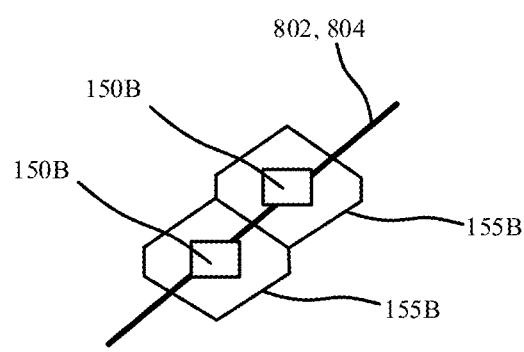
FIG. 29B is a schematic illustration of a global routing path passing through a pair of matrix tiles within a petal in accordance with an embodiment.

FIG. 29A is a schematic top view illustration of a global routing path running through a plurality of petals in accordance with an embodiment. FIG. 29B is a schematic illustration of a global routing path passing through a pair of matrix tiles within a petal in accordance with an embodiment. As shown, the global routing path may be either, or a combination of the global routing lines 802 or modified row lines 804 as previously described. As shown, global routing lines 802 can run column-wise down the display panel through the main body area 102 as described and illustrated with regard to FIG. 8A. In order to service the petals 106, the global routing lines 802 may loop in and out of one or more petals 106. For example, this may occur sequentially through the petals. Each petal 106 may have a corresponding global routing line 802. In an embodiment all petals 106 within a corner of the display panel share a same global routing line 802. Alternatively, modified row lines 804 may extend into each petal rather than the global routing line 802. A variety of configurations are possible for looping the global routing path through the plurality of petals.

In an embodiment, a display structure includes a first global routing path (e.g. global routing line 802) connected to a column of pixel driver chips in a first array of pixel driver chips 150 in the main body area 102 of the display area 105, and a second global routing path (e.g. modified global routing line 802, and/or modified row line 804) connected to a group of second pixel driver chips 150, 150B in the plurality of petals 106 in the display area 105, where the second global routing path loops in and out of one or more petals 106 in a plurality of petals. In an embodiment, the plurality of petals is located along a corner of the display panel 103.

The display panels 103 in accordance with embodiments can initially be manufactured as 2D panel films, followed by the formation of a cutout pattern using a suitable technique such as laser cutting to provide a main body area 102 and petals 106. The particular patterning technique can be selected for example, based on pixel density and street widths and heights of the LED and pixel arrangements. The patterned 2D panel film can then be folded into a 3D compound film curvature, for example along corners or a dome shaped display. As described above, the display panels can include a variety of LED and pixel arrangements, matrix tile arrangements, and cutout patterns in order to facilitate alignment of the pixels when folding the petals, and mitigation of optical artifacts. In particular, variations in pixel density and quality along the trenches between adjacent petals can potentially be visible. In the following description various fabrication techniques and structures are described in order to reduce physical misalignment of adjacent petals, and also to visually obscure the trenches, or seams, between adjacent petals. Together, the structures and fabrication techniques described herein can allow for the fabrication of a display structure with rounded corners, and large curvature.

Referring now to FIGS. 30A-30I, schematic side view illustrations are provided for a method of forming a display structure in accordance with an embodiment. Generally, the method includes a 3D lamination operation of the display panel 103 followed by lamination of a cover plate (e.g. glass, sapphire) 190 to the laminated display panel 103. As will become apparent in the following description, additional processing may be performed to add additional layers (e.g. polarizers, diffusers, black matrix materials, adhesive layers, etc.) using coating or film lamination techniques. Furthermore, various lamination techniques are described for laminating the display panel 103 with controlled petal alignment.

Figure 30A:
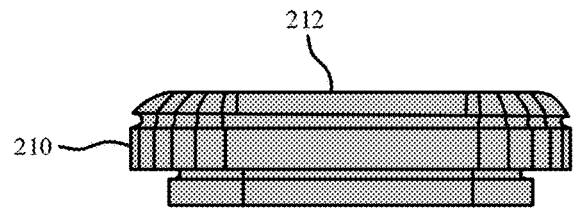
FIGS. 30A-30I are schematic side view illustration of a method of forming a display structure in accordance with an embodiment.

As shown in FIG. 30A a lamination process may begin with a bottom mold 210 with a three-dimensional (3D) compound surface curvature 212. A backfilm layer 160 is then laminated over the bottom mold 210 under heat and pressure as shown in FIG. 30B. For example, the backfilm layer 160 may be a thermoform layer shaped under heat and pressure. The backfilm layer 160 in accordance with embodiments may include a multiple layer stack, and may be formed in multiple laminations. In an embodiment, the backfilm layer 160 includes a bottom flexible display substrate 162 and top adhesive layer 164 (see FIG. 30D). For example, the flexible display substrate may be formed of a variety of polymers, such as polyethylene terephthalate (PET), polyethylene naphthalate (PEN), and polyimide (PI), thin glass, or metal foil. The adhesive layer 164 may function to receive the display panel during lamination. For example, the adhesive layer 164 may be a pressure sensitive adhesive layer. In an embodiment, the adhesive layer 164 includes a dark pigment or filler so as to function as a black matrix layer. The backfilm layer 160 may then optionally be trimmed as shown in FIG. 30C.

Figure 30F:
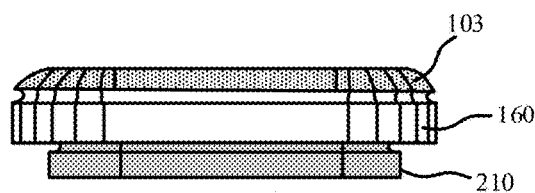
Figure 30B:
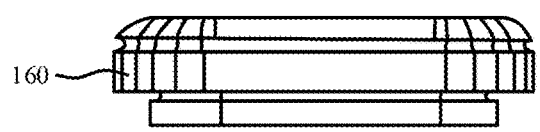
Figure 30G:
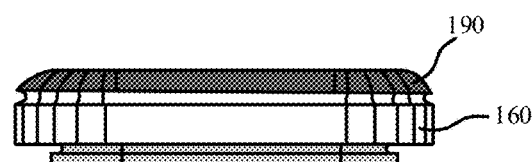
Figure 30C:
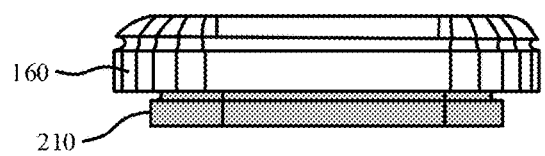
Figure 30H:
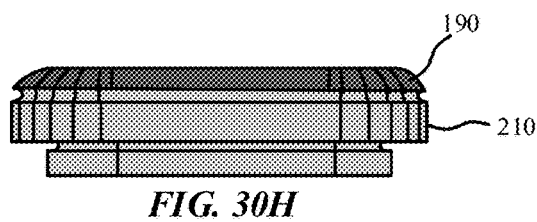
Figure 30D:
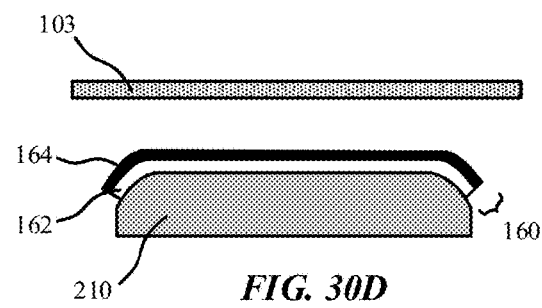
Figure 30I:
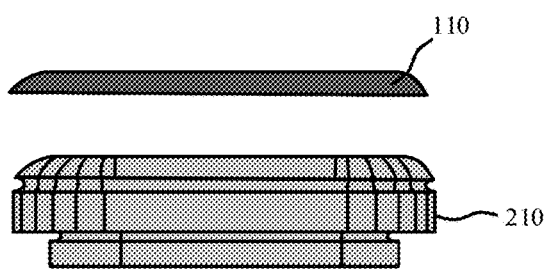
Figure 30E:
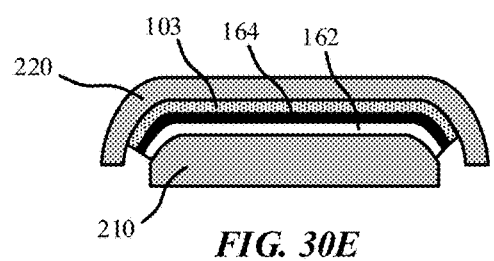

Referring now to FIGS. 30D-30F the display panel 103 is then laminated onto the backfilm layer 160 on the bottom mold. In accordance with embodiments the display panel 103 provided in FIG. 30D includes a cutout pattern that defines a plurality of petals 106, and laminating includes folding the plurality of petals 106 into a curved 3D film contour on top of the laminated backfilm layer 160. FIGS. 30D-30E provide schematic cross-sectional side view illustrations of a lamination process, while FIG. 30F provides a schematic side view illustration of a display panel 103 laminated onto backfilm layer 160. Lamination may be performed using several suitable processes. In the exemplary embodiment illustrated in FIG. 30E a passive or guided molding technique can involve pressing the display panel 103 between the bottom mold 210 and a top mold 220. A cover plate 190 may then be laminated onto the display panel 103 as shown in FIG. 30G, followed by final trimming of the backfilm layer 160 as shown in FIG. 30H, and release of the display structure 110 as illustrated in FIG. 30I.

Exemplary lamination processes in accordance with embodiments include passive (e.g. top/bottom molds), guided, and active petal 106 alignment. In a passive alignment process, the petals may be aligned by virtue of the matching curvature of the top/bottom molds. In a guided petal 106 alignment method the top mold may include an alignment ring or similar structure which is designed with matching female cutout pattern to independently receive the petals 106 and guide the individual petals 106 into its intended 3D curvature. Such a guided approach may provide additional accuracy for aligning seam width (trench 116 width) between adjacent petals in the display panel 103 folded into the curved 3D film contour.

Figure 31A:
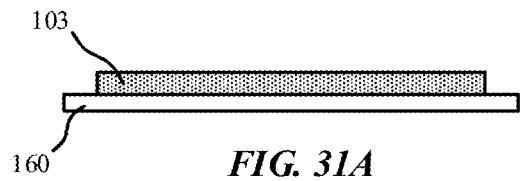
FIGS. 31A-31J are schematic illustrations of a method of laminating a display panel using a protective film with a lower connecting line in accordance with an embodiment.
Figure 31B:
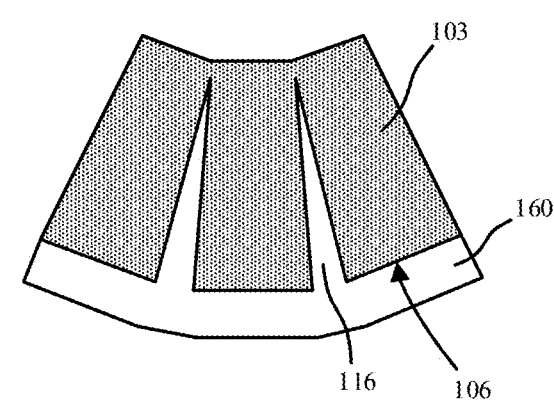
Figure 31C:
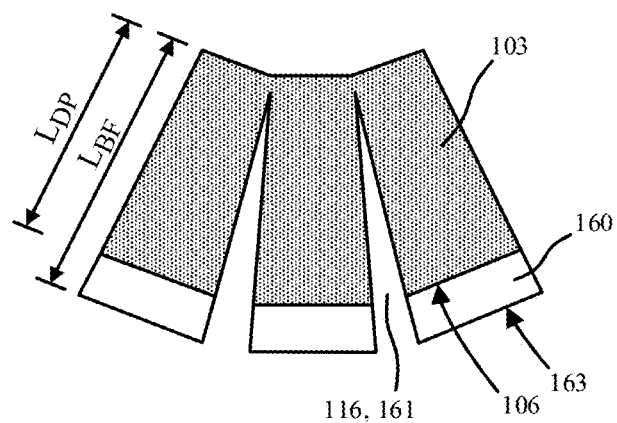

FIGS. 31A-31J are schematic illustrations of a method of laminating a display panel using a protective film with a lower connecting line for active alignment of petals in accordance with an embodiment. FIG. 31A is a close-up schematic cross-sectional side view illustration of a corner of a display panel 103 attached to a backfilm layer 160, or other carrier layer. For example, the display panel may be attached to the top adhesive layer 164 of the backfilm layer 160. FIG. 31B is a schematic top view illustration of FIG. 31A. As shown, the display panel 103 may be pre-cut, including petals 106. Referring to FIG. 31C, the backfilm layer 160 can then be patterned to include a cutout pattern that matches that of the display panel 103 with trenches 161 that match trenches 116, and backfilm layer petals 163 that match display panel petals 106. As shown length ($L_{BF}$) of the backfilm layer petals 163 may be longer than length ($L_{DP}$) of the display panel petals 106.

Figure 31D:
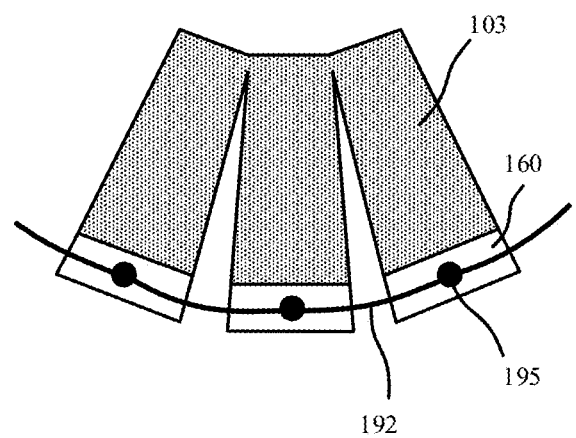

A connecting line(s) (e.g. string) 192 can then be attached at connection areas 195 along the backfilm layer petals 163 as shown in FIG. 31D. Alternatively, connecting line(s) can be pre-attached. Furthermore, the backfilm layer 160 cutout pattern can be pre-patterned prior to bonding to the pre-pattered display panel 103.

Figure 31E:
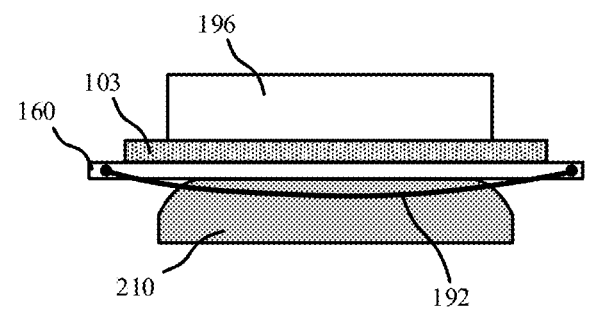
Figure 31F:
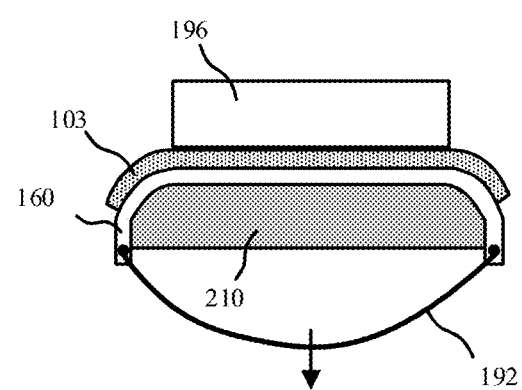

A back side of the backfilm layer is then mounted onto the bottom mold 210 with a 3D compound surface curvature as shown in FIG. 31E. In an embodiment, a top holder 196 can be used to transfer the stack of the display panel 103 and backfilm layer 160. This may be accomplished with an intermediate adhesive layer, or vacuum. The top holder 196 may also press the layer stack to hold in place. In addition, the bottom mold 210 may use vacuum suction for both holding the layer stacks in place and for folding/molding. Once positioned in place, connecting line(s) 192 that is joined to the plurality of backfilm layer petals 163 is pulled to fold the plurality of display panel petals 106 into a curved 3D film contour on top of the backfilm layer 160, which is on top of the bottom mold 210.

Figure 31G:
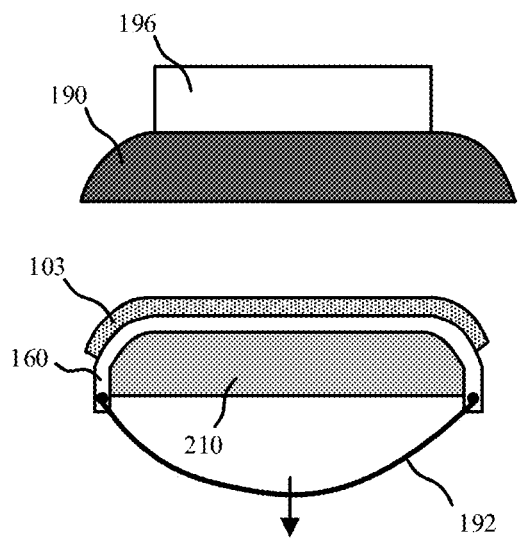
Figure 31H:
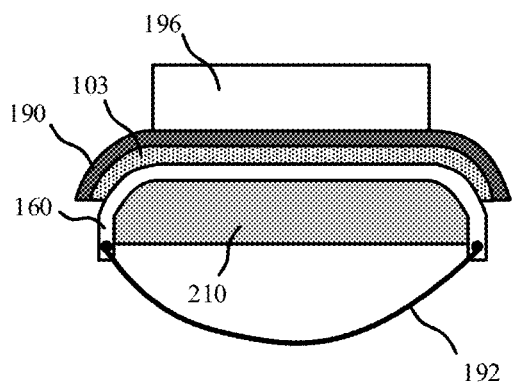
Figure 31I:
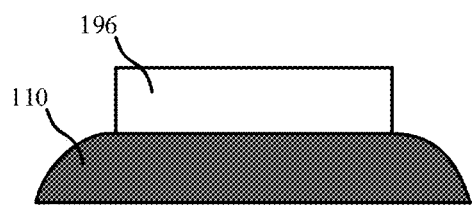
Figure 31J:

Referring now to FIGS. 31G-31H, a cover plate 190 is then positioned over the laminated (and folded) display panel 103, and the cover plate 190 is then laminated onto the display panel 103. The cover plate 190 may be attached to a top holder 196 with an intermediate adhesive layer, or vacuum. The connecting line(s) 192 is then removed, and the backfilm layer 160 is optionally trimmed to shape, as shown in FIG. 31I. The display structure 110, including the cover plate 190, display panel 103, and backfilm layer 160 is then removed from the top holder 196 as shown in FIG. 31J. Additional layers may optionally be included in the display structure 110. For example, various seam filling layers can be applied after folding/molding the display panel 103, and prior to laminating the cover plate 190. Additionally, multiple layers may be formed on the inside, concave, surface of the cover plate 190. For example, a polarizer layer stack can optionally be formed on the cover plate 190 rather than as part of the display panel 103.

Figure 32A:
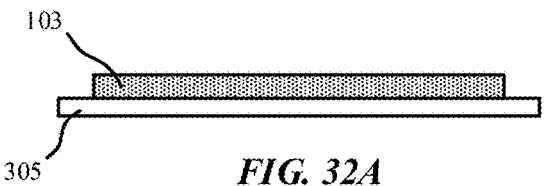
FIGS. 32A-32G are schematic illustrations of a method of laminating a display panel using a protective film with pull tabs in accordance with an embodiment.
Figure 32B:
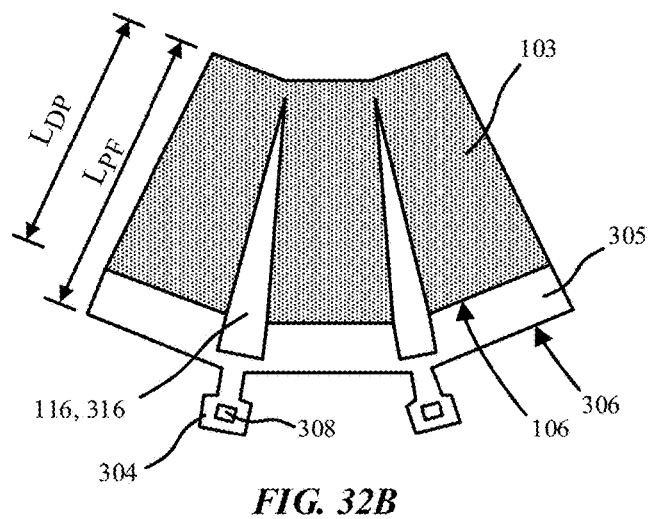
Figure 32C:
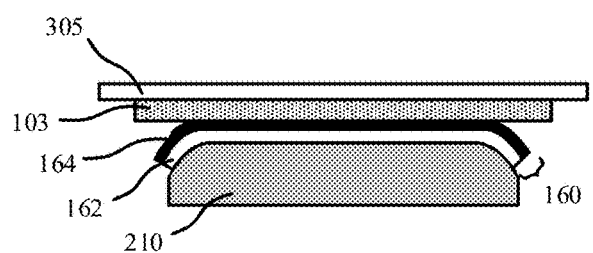

FIGS. 32A-32G are schematic illustrations of a method of laminating a display panel using a protective film with pull tabs for active alignment of petals in accordance with an embodiment. FIG. 32A is a schematic cross-sectional side view illustration of a display panel 103 bonded to a protective film 305. For example, they may be joined with a pressure sensitive adhesive material. Referring now to the schematic top view illustration of FIG. 32B, the cutout pattern including petals 106 and trenches 116, 316 is formed through both the display panel 103 and the protective film 305, for example, by laser cutting to form a corresponding plurality of protective film petals 306 with a length ($L_{PF}$) that is longer than a length ($L_{DP}$) the display panel petals 106. As shown, trenches 116 through the display panel 103 match trenches 316 formed through the protective film 305. In an embodiment, the ends of the petals 306 through the protective film 305 may be joined together by tabs 304 that are aligned with the corresponding trenches 316 between the petals 306. Tabs 304 may optionally include openings 308 for connecting with a jig, for example with hooks.

Figure 32D:
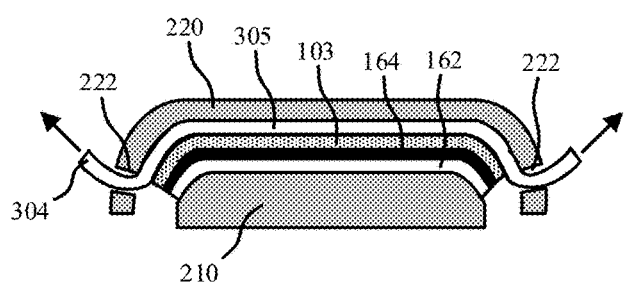
Figure 32E:
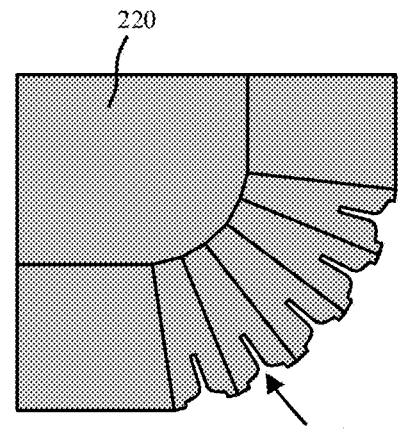
Figure 32F:
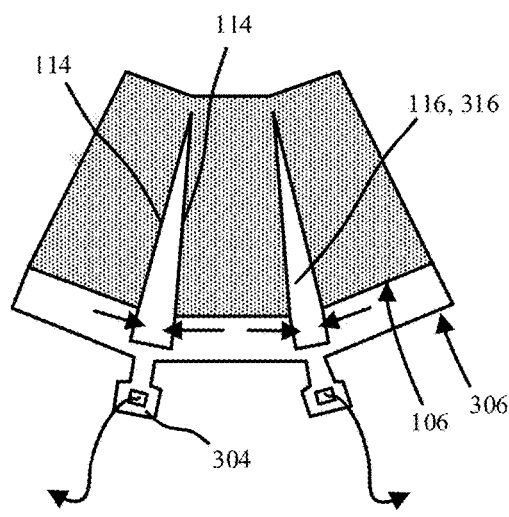
Figure 32G:
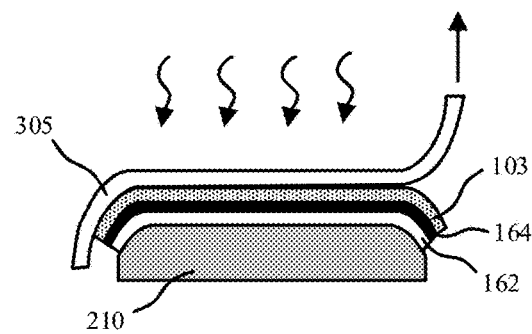

Referring now to the schematic cross-sectional side view illustration in FIG. 32D lamination may include pressing the top mold 220 onto the protective film 305 on the display panel 103, and pulling a plurality of tabs 304 along a periphery of the protective film 305. FIG. 32E is a schematic bottom view of a top mold 220. As shown, the top mold 220 may include a plurality of slits 222 through which the tabs 304 can be pulled and guided to aid in active alignment of the petals 106. Such alignment is illustrated in the schematic cross-sectional side view illustration of FIG. 32F, where it is shown that synchronized pulling of the tabs 304 out of plane (of the protective film 305) creates tension in the protective film 305 petals 306 and draws the edges 114 of display panel 103 petals 106 together, resulting in a narrow trench 116 in the laminated 3D compound film curvature of the display panel 103. In accordance with embodiments, synchronized pulling may be simultaneously pulling of tabs 304, pulling tabs 304 in groups, or one-by-one. In an embodiment the outside petals are folded/pulled prior to interior petals. The protective film 305 can then be released as shown in FIG. 32G, for example using an ultraviolet (UV) release technique.

The fabrication sequence may then proceed in a variety of manners as previously described including filling trenches 116 between adjacent petals 106 of the plurality of petals with one or more seam materials, and lamination of a cover plate 190 onto the display panel 103.

Figure 33:
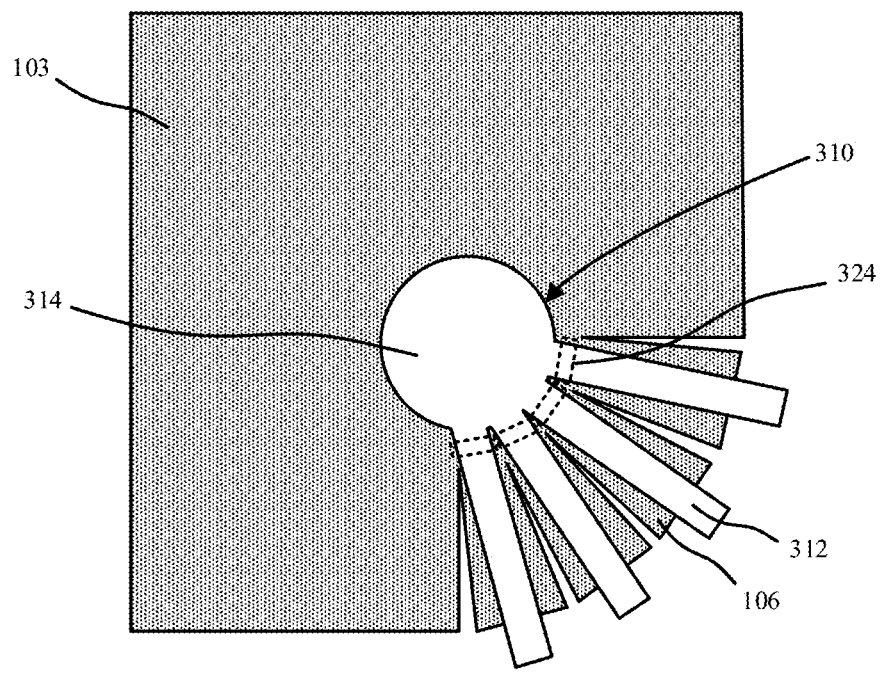
FIG. 33 is a schematic top view illustration of a strip lamination method in accordance with an embodiment.
Figure 34:
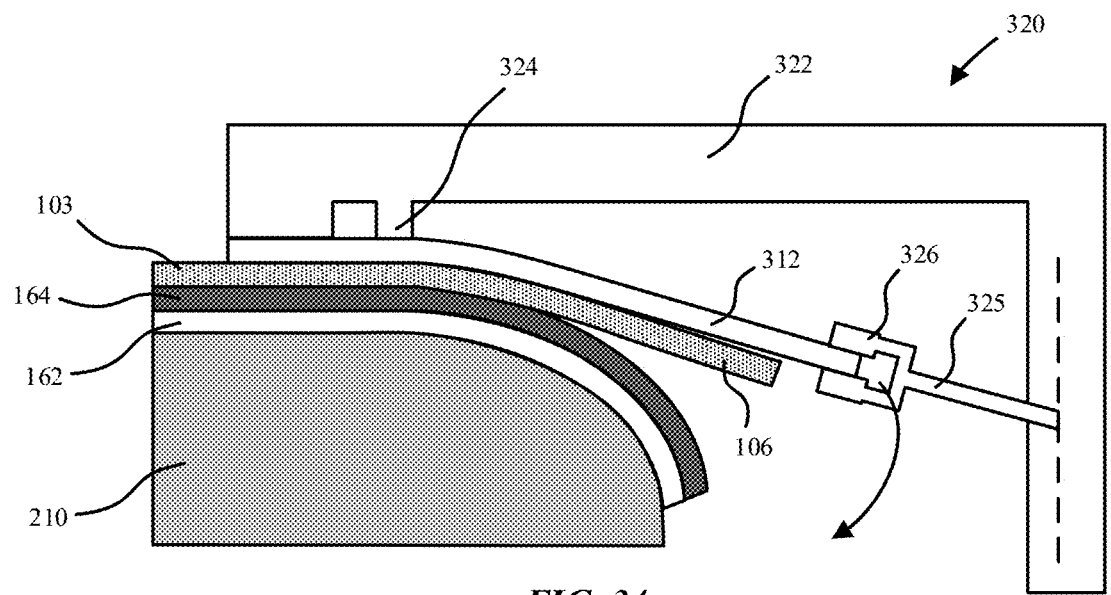
FIG. 34 is a schematic cross-sectional side view illustration of a strip lamination method in accordance with an embodiment.

Referring now to FIGS. 33-34 schematic top view and schematic cross-sectional side view illustrations are provided for a strip lamination method for active alignment of petals in accordance with an embodiment. The strip lamination method illustrated in FIGS. 33-34 is different from the protective film lamination method in several respects. Foremost, the strip lamination method may use a separate protective film tab 310 at each corner of the display panel 103. As shown, each protective film tab 310 may include a root 314 area and a plurality of strips 312 extending from the root 314. The protective film tab 310 may also be formed of a flexible material able to sustain large stress.

In an embodiment, laminating the display panel 103 includes positioning a protective film tab 310 over the display panel 103, where the protective film tab 310 includes a plurality of strips 312 aligned with a plurality of petals 106 of the display panel 103. In particular, each strip 312 may be narrower than a corresponding petal 106. Such an arrangement reduces alignment tolerance when positioning the protective film tab 310 over the display panel. Furthermore, each strip 312 is longer than a corresponding petal 106 to accommodate pulling the strip to fold the corresponding petal 106 into the curved 3D film contour.

As shown in FIG. 34, the strip lamination method may utilize a jig 320 to press the protective film tab 310 on the display panel, and to pull a distal end of each strip 312 downward in a z-direction. In an exemplary structure, the jig 320 may include an arm 322 with a press 324 to provide pressure to the protective film tab 310. The press 324 may be actuated to provide pressure, or the arm 322 may be actuated to provide pressure. The jig 320 may optionally have a retainer to hold the root 314 in place. Alternatively, the root 314 can be maintained in place on the display panel 103 with pressure. Press 324 may be used to provide a small pressure region at a proximal portion of each strip 312 while pulling the strip 312. In operation, a manipulator arm 325 and clamp 326 are used to clamp onto a distal end of a strip 312 and pull the respective strip in the z-direction. In this manner, flexible strip 312 presses the petal 106 towards the bottom mold 210 from the flat area near the proximal end of the strip 312 and the z-motion pulling gradually moves the press area to the free distal end of the petal 106 so the petal finally conforms the curved surface of the bottom mold 210. As a result, motion of the strip 312 and petal 106 can be largely confined to z-motion, and avoid unintentional x-y motion form outside structures. This reduces global manipulation of the petal, and avoids petal alignment inaccuracies that could be introduced by external mechanical movement during lamination. As a result, the final seam width (trench 116 width) becomes largely dependent upon the cutout pattern tolerance.

In accordance with embodiments, the plurality of petals 106 may be simultaneously folded into the curved 3D film contour, or sequentially folded. In an embodiment, outside petals 106 are folded prior to interior petals 106. The fabrication sequence may then proceed in a variety of manners as previously described including filling trenches 116 between adjacent petals 106 of the plurality of petals with one or more seam materials, and lamination of a cover plate 190 onto the display panel 103.

In addition to the above described designs for LED and pixel arrangements, matrix tile arrangements, cutout patterns, and lamination techniques to accurately control physical alignment of adjacent petals during lamination additional seam hiding designs may be incorporated to further visually obscure the trenches, or seams, between adjacent petals. In the following description various seam hiding designs are described and illustrated with particular application for obscuring the trench between adjacent petals within a curved display structure. Exemplary structures include polarizer layers, masking materials, index matched optically clear adhesives, diffuser layers, control of edge roughness, control of trench aspect ratio, and combinations thereof. Furthermore, it is understood that the particular structures may be designed for a particular purpose. It is to be understood however that while separately illustrated and described, some of the embodiments may be combined to achieve multiple results. Furthermore, it is to be appreciated that the following description may be more broadly applicable in display applications to obscure a variety of defect structures in underlying layers such as edges, cuts, debris, pin holes, and other non-uniformities or morphological characteristic, and may not be limited to seam hiding applications.

Figure 35A:
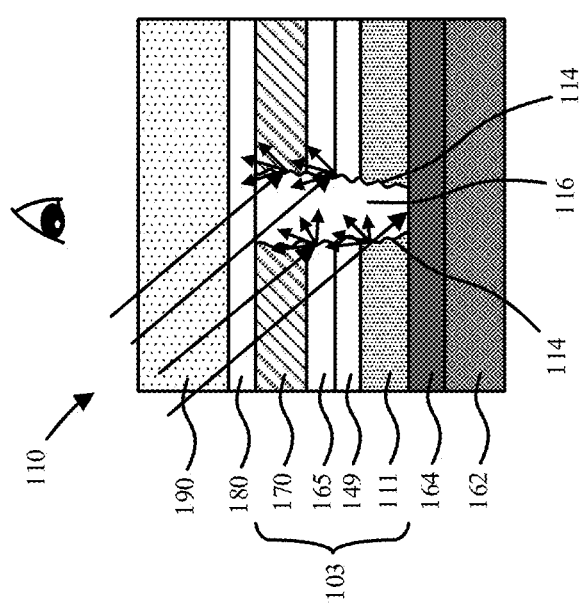
FIGS. 35A-35B are schematic cross-sectional side view and top view illustrations of diffusive reflection along trench edges between petals in accordance with an embodiment.

Referring now to FIGS. 35A-36B exemplary display structure 110 stack-ups are illustrated to explain at least two bases for seam hiding, including diffusive reflection and specular reflection. The display structure 110 stack-ups illustrated in FIGS. 35A and 36A are the same as those described to this point, including a display panel 103 bonded to a backfilm layer 160 including a display substrate 162 and adhesive layer 164. This structure may be laminated into a curved 3D film contour, with trenches 116 located between petals 106. In the exemplary embodiment illustrated, the display panel 103 can include the emissive stack 111 including the LEDs and working circuitry, optional black matrix layer, overcoat layer 149 and polarizer layer 170 optionally joined to the emissive stack 111 (or overcoat layer 149) with an optically clear adhesive layer 165. A cover plate 190, also with a curved 3D film contour can be laminated onto the display panel 103 with optional optically clear adhesive layer 180. For example, the optically clear adhesive layer 180 may be applied as a solid film, or as a liquid coating and cured. Optically clear adhesive materials may include, but are not limited to, polymer families such as acrylates, silicone, etc.

Figure 35B:
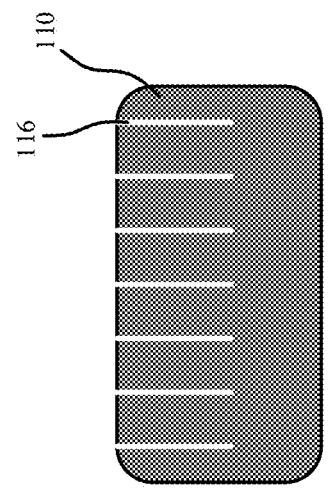

In one aspect is has been observed that the petal edges 114 of trench 116 may cause observable diffusive reflection. For example, with diffusive reflection under sunlight the trenches 116 may be visible as white lines as shown in FIG. 35B. In another aspect it has been observed that specular reflection along the top surfaces of the petals 106 of the display panel 103 (e.g. top surface of polarizer layer 170 illustrated in FIG. 36A) can be different than that for trench 116 resulting in visible black lines as shown in FIG. 36B. In yet another aspect, it has been observed when the display structure is emitting, that the trenches may possibly function as a light guide, where LED emission light from the emissive stack 111 diffuses out from the trenches 116 resulting in glowing trenches. In accordance with embodiments, various seam hiding techniques are described that may obscure visibility of the trenches 116. It is to be appreciated however that different structures may accomplish different objectives, and various embodiments may be combined where appropriate.

In an embodiment, a display structure 110 includes a display panel 103 that includes pixel circuitry connected to a matrix of LEDs within a display area of the display panel. The display area includes a main body area and a plurality of pixels extending from the main body area. A cutout is through the display panel that defines a first edge of a first petal of the plurality of petals and a second edge of a second petal of the plurality of petals. The first and second petals are folded into a curved 3D film contour with a trench 116 between the first petal and the second petal within the curved 3D film contour. In accordance with embodiments, the trench 116 is filled with one or more seam materials. In interest of conciseness, the following embodiments are organized in groups based on polarizer layer location. For example, a polarizer layer can be included in the display structure as part of the display panel through which the cutout pattern is formed or located over the display panel. In some embodiments the polarizer layer is at least partially integrated with the trench, or locally modified adjacent the trench.

Figure 37A:
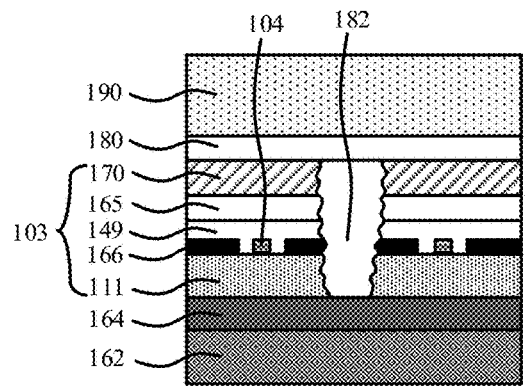
FIGS. 37A-37P are schematic cross-sectional side view illustrations of various seam hiding structures in accordance with embodiments.
Figure 37B:
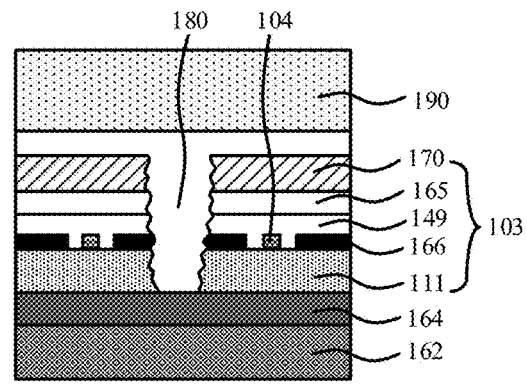
Figure 37C:
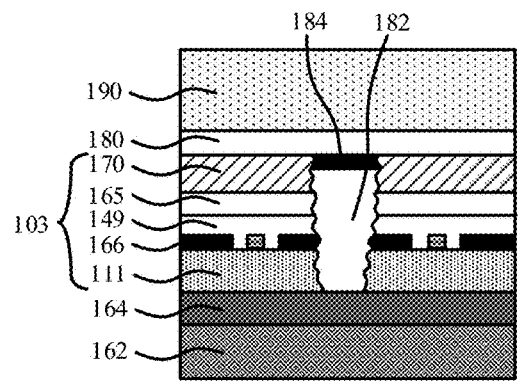
Figure 37D:
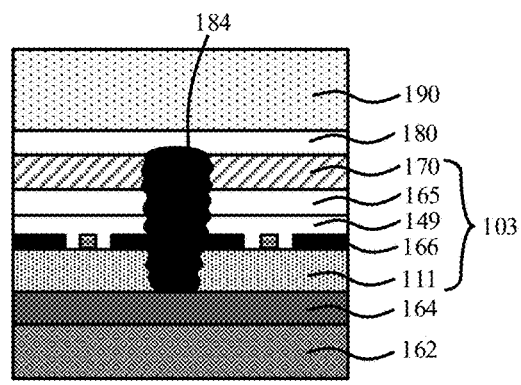
Figure 37E:
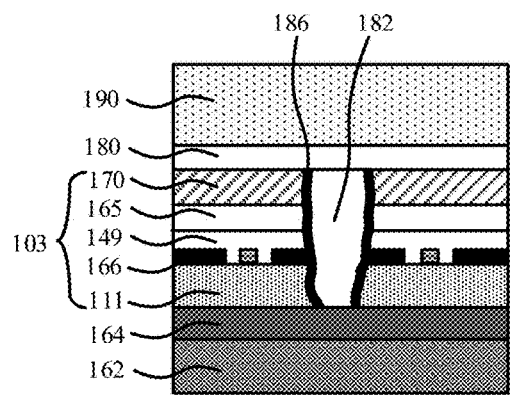
Figure 37F:
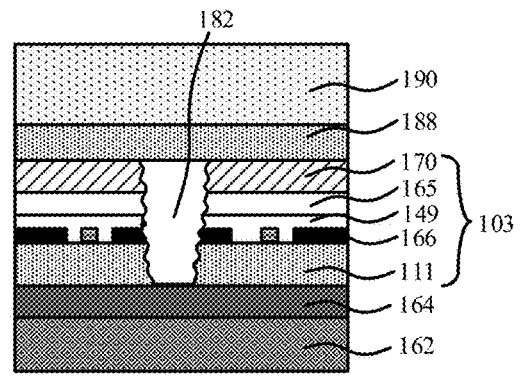
Figure 37G:
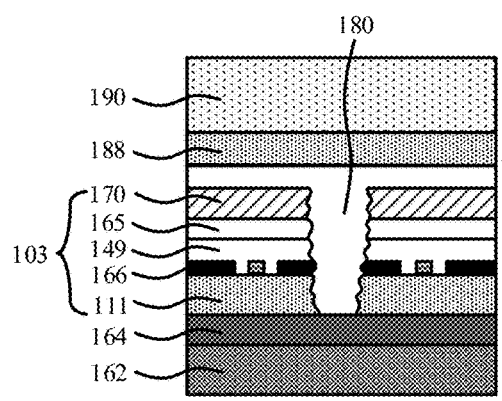
Figure 37H:
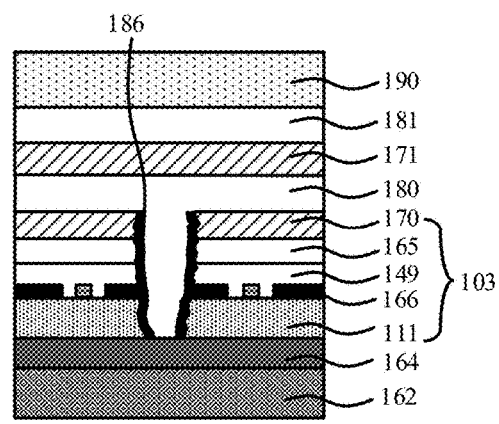
Figure 37I:
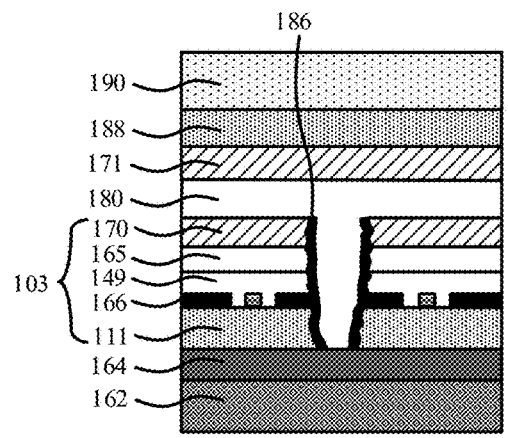
Figure 37J:
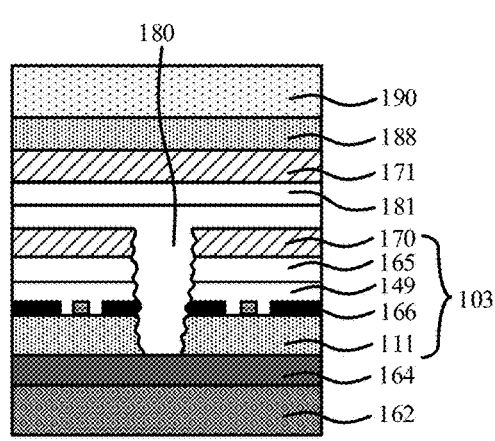
Figure 37K:
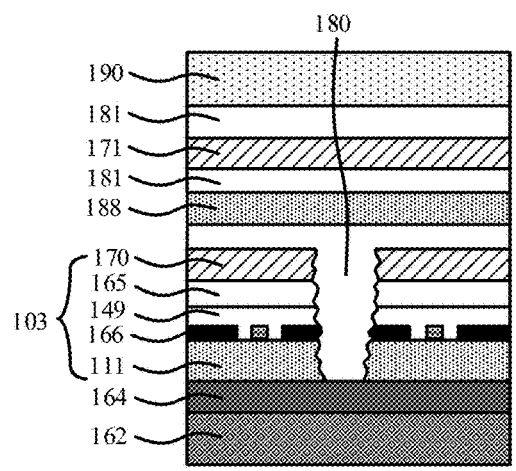
Figure 37L:
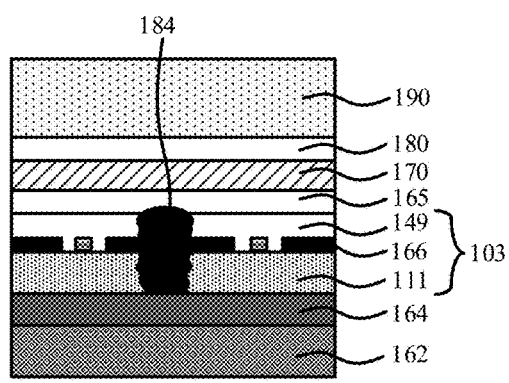
Figure 37M:
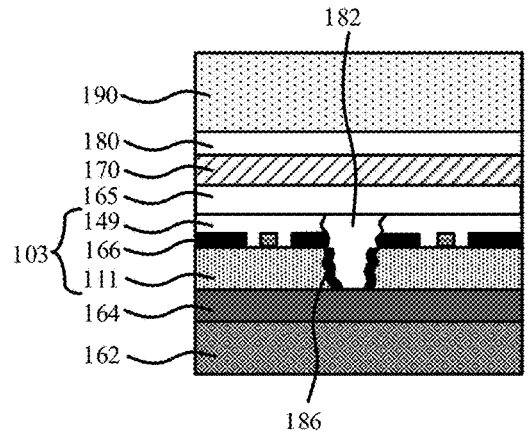
Figure 37N:
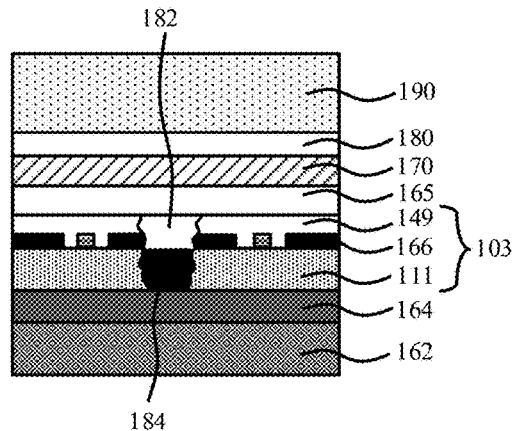
Figure 37O:
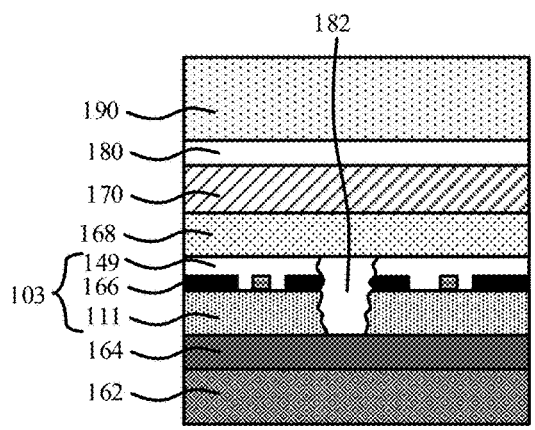
Figure 37P:
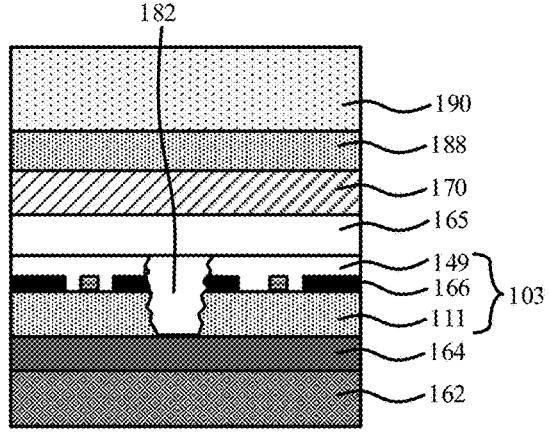

FIGS. 37A-37P are schematic cross-sectional side view illustrations of various seam hiding structures in accordance with embodiments.

Figure 36A:
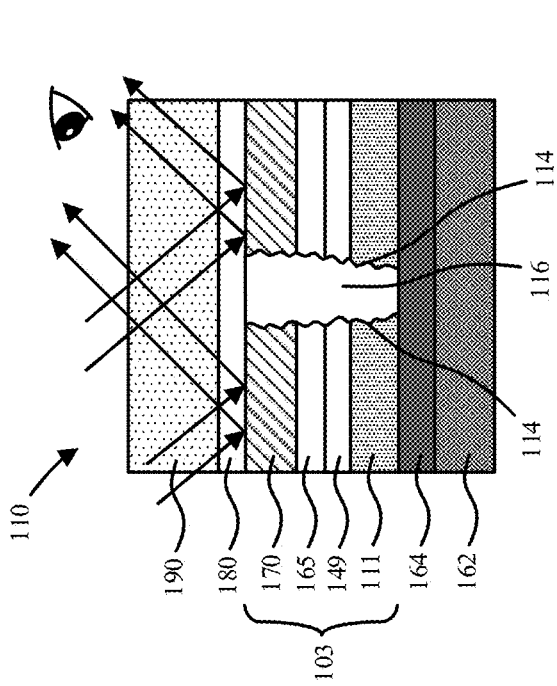
FIGS. 36A-36B are schematic cross-sectional side view and top view illustrations of specular reflection along petals in accordance with an embodiment.
Figure 36B:
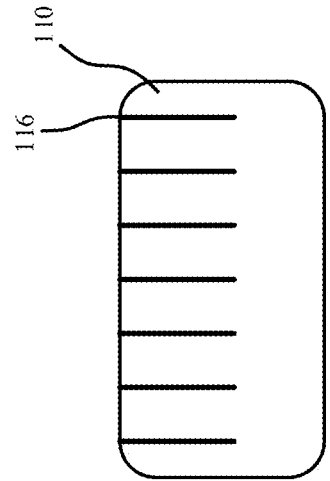

The embodiment illustrated in FIG. 37A is substantially similar to that of the embodiment illustrated in FIGS. 35A and 36A, with the addition of a black matrix layer 166 over the emissive stack 111. Also illustrated for clarity are LEDs 104 of the emissive stack 111 to show the relationship of the black matrix layer 166 and LEDs 104. In accordance with embodiments, the black matrix layer 166 may reduce internal reflection (e.g. specular reflection) of the emissive stack 111, inclusive of reflection from the electrical routing and pixel driver chips 150. Increased area of the black matrix layer 166 may correspond to a decrease in reflectivity of the emissive stack 111. The black matrix layer may be formed of suitable materials, such as polymer and glass and may include organic dye-based absorbers (including mixed molecule dyes) as well as pigment-based absorbers, or particles to absorb a specific visible wavelength spectrum. In an embodiment, the black matrix layer includes carbon-black particles.

In the illustrated embodiment, the trench 116 may be filled with an optically clear fill material 182. The optically clear fill material 182 may be applied in liquid form, e.g. by dispensing, and cured. In an embodiment, the optically clear fill material 182 is characterized by an index of refraction within 0.2 of an index of refraction of the optically clear adhesive layer 165 over the emissive stack 111, overcoat layer 149, optically clear adhesive layer 180, and/or cover plate 190 to be applied. In some embodiments, the optically clear fill material 182 can be index matched to a variety of surrounding materials in the emissive stack 111, overcoat layer 149, and polarizer layer 170 as well. In this manner, the optically clear fill material 182 can reduce diffusive reflection at the trench 116 edges.

The embodiment illustrated in FIG. 37B is substantially similar to that of the embodiment illustrated in FIG. 37A with the variation in that the trench is filled with the optically clear adhesive layer 180. In an embodiment, the optically clear adhesive layer 180 is applied in liquid form. The optically clear adhesive layer 180 may be characterized as an optically clear fill material, which is continuous layer spanning over the first and second petals and within the trench.

The embodiment illustrated in FIG. 37C is substantially similar to that of the embodiment illustrated in FIG. 37A with the variation in that the trench is filled with multiple seam materials, including the optically clear fill material 182 and an opaque fill material 184 within the trench and over the optically clear fill material 182. The opaque fill material 184 may be a similar material as black matrix layer 166, for example. In such a configuration, the opaque fill material 184 prevents ambient light from entering the trenches 116. The opaque fill material 184 can also block LED 104 light that is leaked at the trenches 116.

In addition, it has also been observed that it can be possible for bubbles, or air gaps, to form within the trenches 116 even with optically clear fill material 182 or optically clear adhesive layer 180. For example, this may be attributed to trench 116 aspect ratio or viscosity of the optically clear fill material 182 or optically clear adhesive layer 180 when applied to the trenches 116. Reflection can increase significantly if bubble, or air gaps are present. Accordingly, a top layer of the opaque fill material 184 may mitigate the effect of such bubbles or air gaps. In an embodiment, opaque fill material 184 may also be index matched with surrounding layer(s).

The embodiment illustrated in FIG. 37D is substantially similar to that of the embodiment illustrated in FIG. 37A with the variation in that the trench is filled with opaque fill material 184. In such an embodiment, the trench 116 may be substantially filled with the opaque fill material 184. In an embodiment, the opaque fill material 184 is applied in liquid form. In an embodiment, opaque fill material 184 may also be index matched with surrounding layer(s).

The embodiment illustrated in FIG. 37E is substantially similar to that of the embodiment illustrated in FIG. 37A with the variation in that an opaque liner material 186 is formed within the trench 116 and between optically clear fill material 182 and the first and second petals. Opaque liner material 186 may be a similar composition as the opaque fill material 184 and may also be index matched with surrounding layer(s). Opaque liner material 186 may be applied using a suitable technique such as patterning and deposition, pen, or brush application. Furthermore, the opaque liner material 186 can be applied prior to or after folding the display panel 103 into the curved 3D film contour.

Referring now to the embodiment illustrated in FIG. 37F, a diffuser layer 188 is located over the panel 103, and spans over the trench 116. The diffuser layer 188 may be similar as the optically clear adhesive layer 180, with the addition of particle fillers such as $TiO_2$ to scatter light, for example from specular reflection, diffusive reflection, and emission from the LEDs 104. In this manner, the diffuser layer 188 may have a blurring effect to reduce visibility of the trenches 116.

The embodiment illustrated in FIG. 37G is substantially similar to that of the embodiment illustrated in FIG. 37F, with the addition of optically clear adhesive layer 180 being used to fill the trench 116 rather than optically clear fill material 182.

In the following embodiments described with regard to FIGS. 37H-37K, a second polarizer layer 171 is provided to additionally reduce diffusive and specular reflection, and provide seam hiding function. In an embodiment second polarizer layer 171 is an absorptive linear polarizer. For example, the second polarizer layer may be an iodine doped polyvinyl alcohol (PVA) plastic which linearly polarizes light by absorbing light parallel to stretched PVA chains, and transmitting light perpendicular to the stretched PVA chains. In an embodiment, the second polarizer layer 171 is different from the first polarizer layer 170. In an embodiment, the first polarizer layer 170 includes a circular polarizer (including a linear polarizer and a retarder layer such as a quarter wave plate layer), while the second polarizer layer is a linear polarizer. In an embodiment the linear polarizers for both the first polarizer layer 170 and second polarizer layer 171 are aligned, so that light transmitted through the first polarizer layer 170 is allowed to transmit through the second polarizer layer 171, while a portion of light emitting from the trench 116 is absorbed. The second polarizer layer 171 can be also combined with various other seam hiding structures.

In the embodiment illustrated in FIG. 37H, an opaque liner material 186 is provided along the petal sidewalls within the trench 116, and between an optically clear fill material such as optically clear adhesive layer 180 and the petals. In addition, a second polarizer layer 171 is provided over the optically clear adhesive layer, along with a second optically clear adhesive layer 181 to secure the cover plate 190 to the second polarizer layer 171.

The embodiment illustrated in FIG. 37I is similar to the embodiment illustrated in FIG. 37H in which the second optically clear adhesive layer 181 is replaced with a diffuser layer 188.

The embodiment illustrated in FIG. 37J is similar to the embodiment illustrated in FIG. 37I with the addition of a second optically clear adhesive layer 181 over optically clear adhesive layer 180. In this manner, optically clear adhesive layer 180 can be applied in liquid form to exploit trench filling capability, while optically clear adhesive layer 180 can be applied in tape form for attaching the second polarizer layer 171.

The embodiment illustrated in FIG. 37K provides an additional variation where the diffuser layer 188 is instead located beneath the second polarizer layer 171.

Up until this point embodiments have been illustrated and described in which a polarizer layer 170 is included as part of the display panel 103 which is patterned (e.g. laser cut) to form trenches 116. In other embodiments, the polarizer layer 170 is formed after patterning the display panel 103. In this manner, the polarizer layer 170 can provide hiding function for a variety of defect structures, including but not limited to the trenches or seams. In such embodiments, the polarizer layer spans over the display area 105 of the display panel 103 and over the trenches 116.

Referring now to the embodiment illustrated in FIG. 37L, this is similar to the embodiment illustrated in FIG. 37D, with the difference being the polarizer layer 170 is added after forming the cutout pattern through the display panel. Furthermore, the polarizer layer 170 and opaque fill material 184 can be added after folding the display panel 103 into the curved 3D film contour.

In the embodiment illustrated in FIG. 37L, the opaque fill material 184 can reduce diffusive reflection from the seam. It is not necessary for the opaque fill material 184 to completely fill the trench. For example, referring to FIG. 37M an opaque liner material 186 can be applied along the sidewalls of the petals. In an embodiment, the opaque liner material 186 rises to at least the black matrix layer 166. The opaque liner material 186 can be applied to the petal sidewalls along the entire thickness of the trench. In the embodiment illustrated in FIG. 37N, the opaque fill material 184 only partly fills the trench. For example, the opaque fill material 184 can fill the trench at least up to the black matrix layer 166. In both instances, an optically clear fill material 182 can be used to fill the remainder of the trench. In the embodiment illustrated in FIG. 37O, a diffuser layer 168 spans over the trench 116 and underneath the polarizer layer 170. The diffuser layer 168 can create a haze that obscures the seam. Furthermore, and optically clear fill material 182 can fill the trench to further reduce diffusive reflection from the seam. In the embodiment illustrated in FIG. 37P, a diffuser layer 188 spans over the trench 116 and over the polarizer layer 170.

The polarizer layers 170 in accordance with embodiments may include a variety of different layer stacks. For example, polarizer layer 170 may be a circular polarizer including a linear polarizer layer and a retarder layer (e.g. quarter wave plate layer). Additional layers, such as an additional retarder layer(s), and additional compensation retarder layers can optionally be included depending upon application. In traditional display fabrication sequences polarizer stack-ups are formed as laminated, flat films. It has been observed that polarizer films can be sensitive to temperature or stress, particularly when laminated into a curved 3D film contour. In accordance with some embodiments, liquid solution coating techniques can be utilized to formed some or all of the polarizer stack-up layers. In this manner, temperature and stress can be reduced in the curved 3D polarizer film contours, which can preserve optical quality of the films. Furthermore, liquid solution coating techniques can also allow stack reduction (layers, total thickness) by removing carrier films (such as optically clear adhesive layers).

Figure 38:
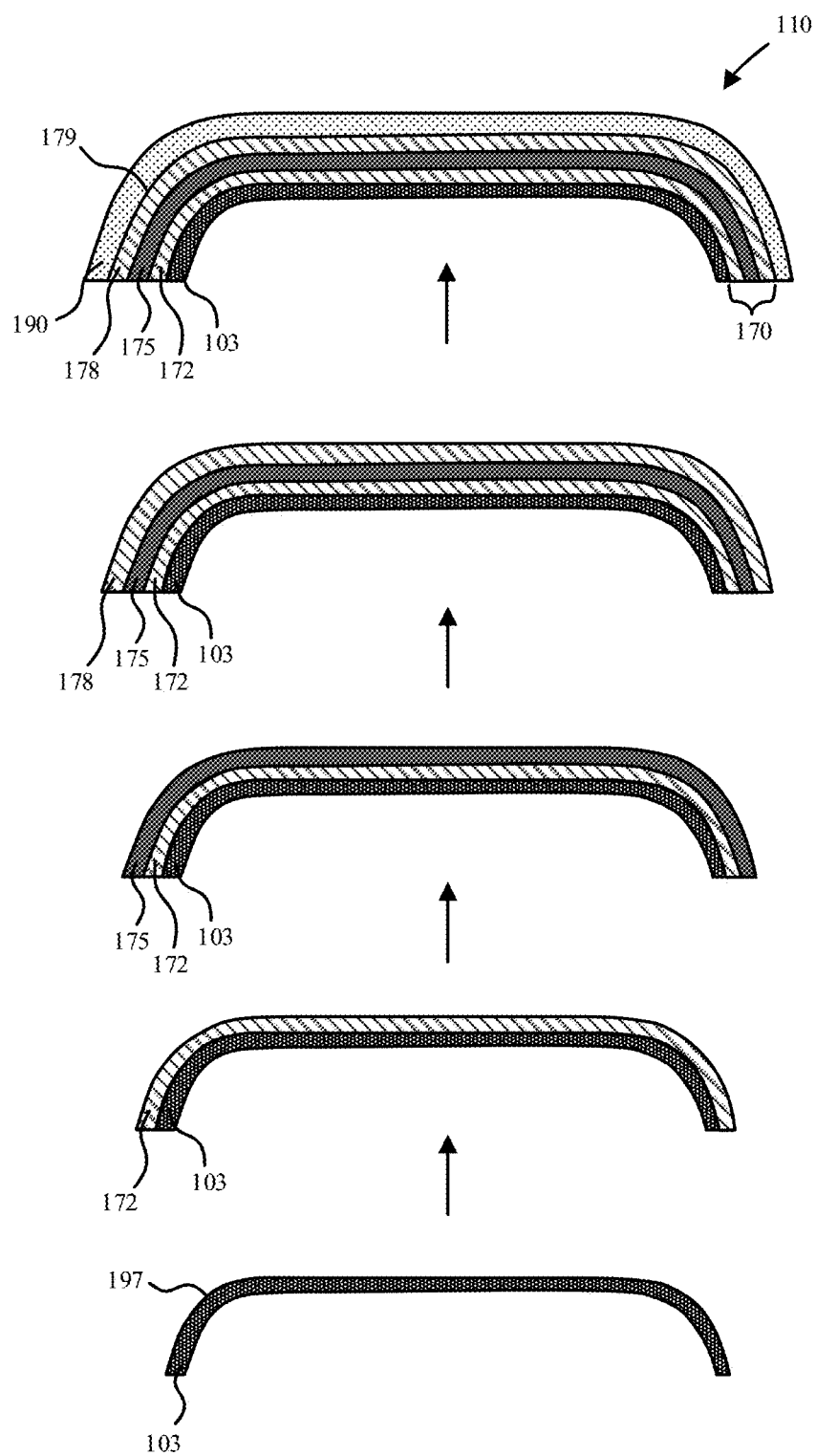
FIG. 38 is a schematic cross-sectional side view illustration of a method of forming a display structure on a display panel with a convex 3D film contour in accordance with an embodiment.

FIG. 38 is a schematic cross-sectional side view illustration of a method of forming a display structure 110 on a display panel 103 with a convex 3D film contour in accordance with an embodiment. As shown, the process sequence begins with a display panel 103 that has been cut and folded into a 3D film contour. An inner retarder layer 172 (e.g. quarter wave plate layer) is formed on a convex outer surface 197 the display panel 103, followed by formation of the linear polarizer layer 175 and outer retarder layer 178 (e.g. quarter wave plate layer). A cover plate 190 can then be laminated onto a convex outer surface 179 the polarizer layer 170.

In an embodiment, a method of forming a display structure 110 includes forming a polarizer layer 170 stack on a convex outer surface 197 of a display panel 103, and lamination of a cover plate 190 onto a convex outer surface 179 of the polarizer layer 170 stack on the display panel 103. In an embodiment, forming the polarizer layer 170 stack includes coating an inner retarder layer 172 on the display panel using a first solution-based technique, coating a linear polarizer layer 175 on the inner retarder layer 172 using a second solution-based technique, and coating an outer retarder layer 178 on the linear polarizer layer 175 using a third solution-based technique. Any of the solution-based coating techniques may be the same, or different techniques, and can optionally be replaced with a solid film lamination technique.

Figure 39:
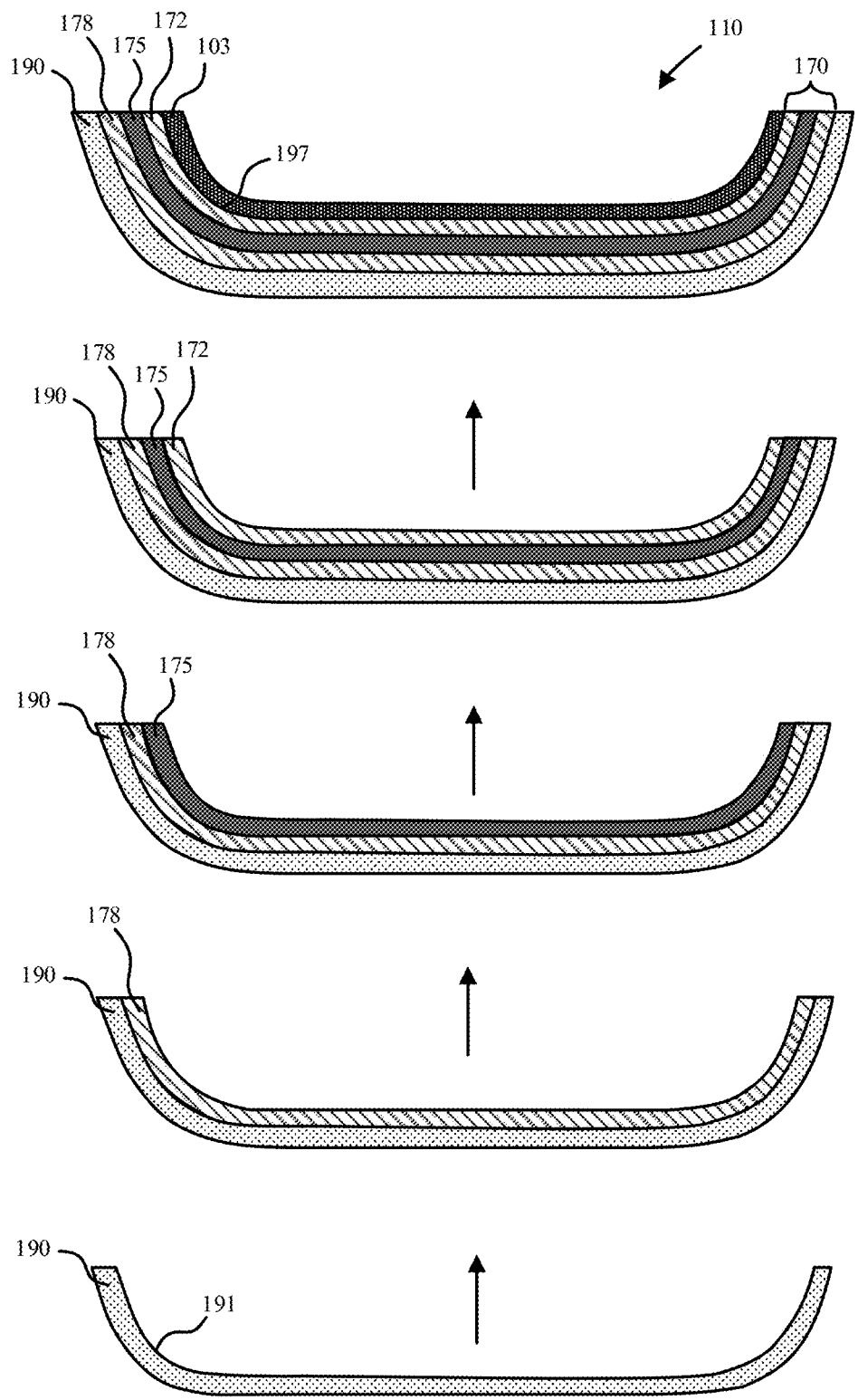
FIG. 39 is a schematic cross-sectional side view illustration of a method of forming a display structure on a cover plate with a concave 3D film contour in accordance with an embodiment.

FIG. 39 is a schematic cross-sectional side view illustration of a method of forming a display structure 110 on a cover plate 190 with a concave 3D film contour in accordance with an embodiment. As shown, the process sequence begins with a cover plate 190 with a 3D film contour. An outer retarder layer 178 is formed on an inside surface 191 (concave surface) the cover plate 190, followed by formation of the linear polarizer layer 175 and inner retarder layer 172. A cut and folded 3D display panel 103 can then be laminated onto the polarizer layer 170.

In an embodiment, a method of forming a display structure 110 includes forming a polarizer layer 170 stack on an inside surface 191 of a concave cover plate 190, and laminating the polarizer layer 170 and the cover plate 190 onto a convex outer surface 197 of a display panel 103. In an embodiment, forming the polarizer layer 170 stack-up includes coating an outer retarder layer 178 on the concave cover plate 190 using a first solution-based technique, coating a linear polarizer layer 175 on the outer retarder layer 178 using a second solution-based technique, and coating an inner retarder layer 172 on the linear polarizer layer 175 using a third solution-based technique. Any of the first, second, and third solution-based techniques may be the same, or different techniques, and can optionally be replaced with a solid film lamination technique.

Referring now to FIGS. 40A-40D schematic cross-sectional side view illustrations are provided of display structures 110 including polarizer layer 170 stack-ups and display panels 103 with curved 3D film contours in accordance with embodiments. The polarizer layer 170 illustrated in FIG. 40A includes an inner retarder layer 172, linear polarizer layer 175 and outer retarder layer 178. The inner retarder layer 172 and linear polarizer layer 175 together may form a circular polarizer. Thus, the outer retarder layer 178 can be an additional layer formed over a circular polarizer.

The individual layers of the polarizer layer 170 stack-up can be formed using either solid film or liquid solution coating techniques, and combinations thereof, and can be formed or coated onto the display panel or cover plate. An exemplary retarder layer may be formed using the following sequence. First a primer layer can optionally be applied using a suitable technique such as spin coating, spray coating, physical vapor deposition, lamination, etc. followed by drying and curing (e.g. UV cure). An alignment layer is then coated using a suitable technique such as spin coating, spray coating, lamination, etc. followed by thermal drying (baking). The alignment layer can then be cured with a polarized UV cure, using a mask patterned with certain orientation. The alignment layer will control orientation of the quarter wave plate film. A liquid crystal layer is then coated onto the alignment layer using a suitable technique such as spin coating, spray coating, lamination, etc. followed by drying (baking) and curing (e.g. UV cure). The liquid crystal layer will control birefringence and retardation of the retarder layer. The linear polarizer layer 175, and any other compensation retarder layers can be formed using similar liquid solution-based processing techniques.

Figure 40A:
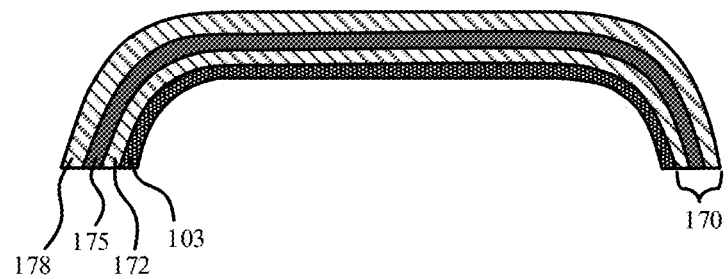
FIGS. 40A-40D are schematic cross-sectional side view illustrations of display structures including polarizer stack-ups and display panels with curved three-dimensional (3D) film contours in accordance with embodiments.

Still referring to FIG. 40A, the particular stack-up architecture may be useful to reduce display reflectance and emissive distortion for sunglass users. An exemplary optical reflectance path may include random oriented light entering the outer retarder layer 178, which will pass random oriented light to the linear polarizer layer 175, which in turn passes linearly polarized light (e.g. vertical). This linearly polarized light is then rotated by the inner retarder layer 172 to be circular oriented light. The circular oriented light is reflected off of the display panel 103, and shifted in handedness. This reflected light is then rotated again by the inner retarder layer 172 so that the light is now linearly polarized again, and shifted by 90 degrees (e.g. horizontal). In this example, the horizonal polarized light is then absorbed by the linear polarizer layer 175 and is not passed to the outer retarder layer.

With regard to emissive function, the display panel 103 emits random oriented light, which is passed by the inner retarder layer 172 to the linear polarizer layer 175, which passes linearly polarized light (e.g. vertical), which is then turned to circular light by the outer retarder layer 178. An observer or user wearing sunglasses that commonly include a linear polarizer layer will then see linearly polarized light, which can reduce distortion.

Figure 40B:
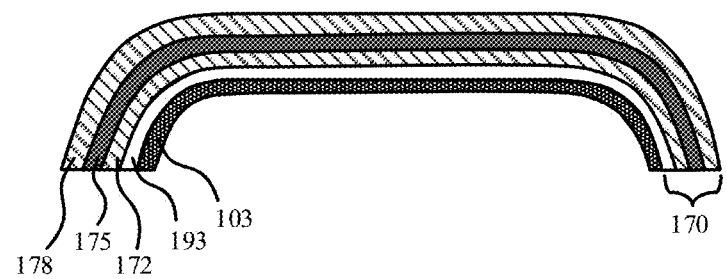

The polarizer layer 170 illustrated in FIG. 40B is similar to the polarizer layer 170 of FIG. 40A with the addition of an inner compensation retarder layer 193 formed between the display panel 103 and the inner retarder layer 172. The inner compensation retarder layer 193 may be similar to the inner retarder layer 172, only patterned to slightly adjust the phase of the circular light (e.g. vertical and horizontal components). It has been observed that an inner retarder layer 172 may not function to cause a 45 degree phase shift at large viewing angles, thus resulting in higher display reflectance at wider viewing angles. The inner compensation retarder layer 193 may be used to reduce display reflectance across a wide range of viewing angles.

Figure 40C:
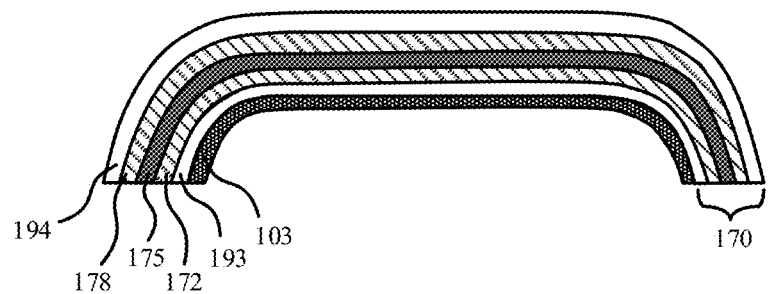

The polarizer layer 170 illustrated in FIG. 40C is similar to the polarizer layer 170 of FIG. 40B with the addition of an outer compensation retarder layer 194 formed on the outer retarder layer 178. In this architecture the outer compensation retarder layer 194 may be used to reduce perceived distortion across a wide range of viewing angles in cases when a user or observer is wearing polarized sunglasses.

Figure 40D:
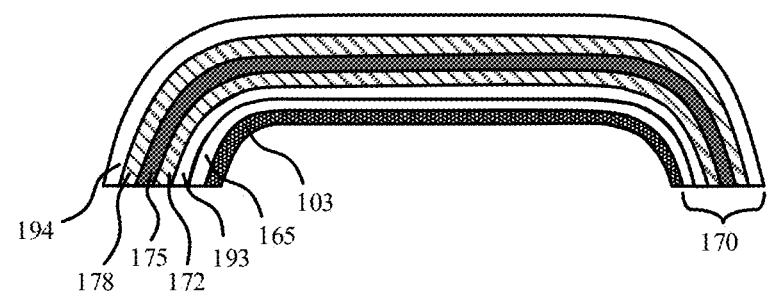

The polarizer layer 170 illustrated in FIG. 40D is similar to the polarizer layer 170 of FIG. 40C with the addition of an optically clear adhesive layer 165. For example, the optically clear adhesive layer 165 can be used for laminating the polarizer layer onto the display panel 103, as well as for filling trenches 116 between petals of the display panel 103 similarly as the optically clear fill material 182 previously described.

It is to be appreciated that embodiments illustrated in FIGS. 40A-40D are illustrative, and embodiments are not so limited. Other arrangements of compensation retarder layers, retarder layers, and linear polarizer layers are possible. For example, an outer compensation retarder layer 194 can be provided without an inner compensation layer 193, and so forth.

Figure 41A:
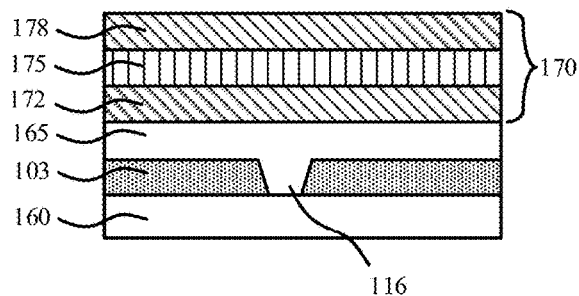
FIGS. 41A-41E are schematic cross-sectional side view illustrations of various polarizer layer stack-ups for seam hiding in accordance with embodiments.
Figure 41B:
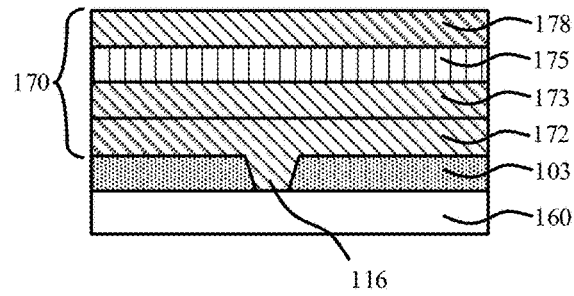

Referring now to FIGS. 41A-41E schematic cross-sectional side view illustrations are provided of various polarizer layer 170 stack-ups for seam hiding in accordance with embodiments. Referring to FIG. 41A a display structure stack-up is illustrated in which an optically clear adhesive layer 165 can be used to fill the trench 116. Similar to the discussion related to FIGS. 37A-37P, the optically clear adhesive layer 165 can be used in particular to reduce diffusive reflection from the trench 116. The optically clear adhesive layer 165 can also be used for bonding to the polarizer layer 170, in particular where the polarizer layer 170 is formed on the display panel 103 using solid film-based techniques.

In accordance with other embodiments, a portion of the polarizer layer 170 can be used for trench 116 filling. In particular, this may be achieved when using liquid solution-based deposition techniques for one or more layers of the polarizer layer 170 stack-up. In an embodiment, the polarizer layer 170 spans over the display area 105 of the display panel 103 and within the trenches 116 between the petals. Referring now to the embodiment illustrated in FIG. 41B, inner retarder layer 172 is formed over the display panel 103 and within the trench 116. A second inner retarder layer 173 can then optionally be formed over the inner retarder layer 172. Alternatively, an inner compensation retarder layer 193 such as that described with regard to FIG. 40D can be formed within the trench 116. The inner retarder layer 172 (e.g. for primary retardance) can be formed on the inner compensation retarder layer 193. In either configuration, a type of retarder layer is formed within the trench 116. Subsequent solution-based or solid film-based techniques can then be utilized for the formation of the additional polarizer layer 170 stack-up.

In an embodiment, the polarizer layer 170 includes a retarder layer (e.g. inner retarder layer 172, inner compensation retarder layer 193) spanning over the display area 105 of the display panel 103 and within the trenches 116. A linear polarizer layer 175 is formed over the retarder layer, and spans over the display area of the display panel and over the trenches 116.

Figure 41C:
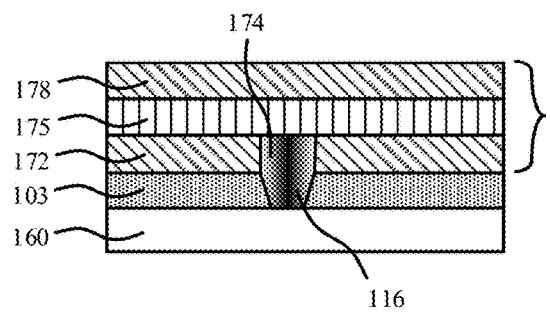
Figure 41D:
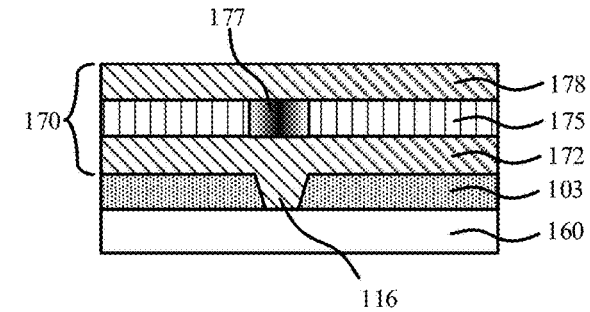

Referring now to the embodiments illustrated in FIGS. 41C-41D, the layers forming the polarizer layer 170 can be locally treated above and within the trench 116 to control optical properties. In the embodiment illustrated in FIG. 41C a region 174 of the inner retarder layer 172 within and directly above the trench 116 is characterized by a different orientation than a region of the inner retarder layer 172 directly above the first and second petals. For example, this may be achieved by a patterned photo-alignment process. Region 174 may have a different birefringence compared to the area of the inner retarder layer 172 over the petals. A different birefringence may be used to match the total retardance of region 174 with the rest of the inner retarder layer 172. Alternatively, a different retardance can intentionally be introduced. In the embodiment illustrated in FIG. 41D a region 177 of the linear polarizer layer 175 directly above the trench is characterized by a different linear orientation than a region of the linear polarizer directly above the first and second petals. For example, this may be achieved by a patterned photo-alignment process.

Figure 41E:
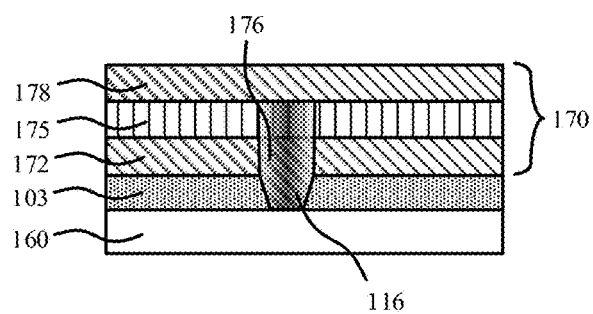

The embodiment illustrated in FIG. 41E provides a similar region 176 of both the inner retarder layer 172 and linear polarizer layer 175 that can be prepared by patterned photo-alignment processes. In such a technique, localized alignment and orientation control can be used to provide a gradual change of transmission at the trench 116 region to reduce visualization of the seam.

In utilizing the various aspects of the embodiments, it would become apparent to one skilled in the art that combinations or variations of the above embodiments are possible for forming a display panel with 3D compound curvature. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display structure comprising:
   a display panel that includes pixel circuitry connected to a matrix of light emitting diodes (LEDs) within a display area of the display panel, wherein the display area includes a main body area and a plurality of petals extending from the main body area; and
   a cutout through the display panel that defines a first edge of a first petal of the plurality of petals and a second edge of a second petal of the plurality of petals, wherein the first and second petals are folded and aligned with one another in a curved three-dimensional (3D) film contour such that a trench is formed between the first edge of the first petal and the second edge of the second petal within the curved 3D film contour and within the display area.

2. The display structure of claim 1, wherein the first petal includes a first array of LEDs positioned in a first grid with a first repeating x-y pixel pitch, and the second petal includes a second array of LEDs positioned in a second grid of a second repeating x-y pixel pitch; and
   wherein the first grid is offset with the second grid, and the first repeating x-y pixel pitch is the same as the second repeating x-y pixel pitch.

3. The display structure of claim 1, comprising a first plurality of first cutouts through the display panel and a corresponding first plurality of first trenches, and a second plurality of second cutouts through the display panel and a corresponding plurality of second trenches, wherein the first plurality of first trenches is substantially orthogonal to the second plurality of second trenches;
   wherein the first plurality of first trenches is substantially orthogonal to the second plurality of second trenches about a corner of the curved three-dimensional (3D) film contour.

4. The display structure of claim 1, wherein the first edge and the second edge are in a zigzag pattern.

5. The display structure of claim 1, wherein the matrix of LEDs includes an array of pixels, each pixel including a pair of first color emitting LEDs arranged in a first direction, a pair of second color emitting LEDs arranged orthogonal to the first direction, and a pair of third color emitting LEDs arranged orthogonal to the first direction;
   wherein the trench runs through at least one pixel in the array of pixels, such that one of the pair of second color emitting LEDs is missing and one of the pair of third color emitting LEDs is missing.

6. The display structure of claim 1, wherein the matrix of LEDs includes an array of pixels, each pixel including:
   a first subpixel cluster including a pair of first color emitting LEDs, and a pair of second color emitting LEDs; and
   a second subpixel cluster including a pair of third color emitting LEDs, and a second pair of the second color emitting LEDs;
   wherein a street width between the first subpixel cluster and the second subpixel cluster is greater than pitches between the pair of first color emitting LEDs and the pair of second color emitting LEDs within the first subpixel cluster, and the street width between the first subpixel cluster and the second subpixel cluster is greater than pitches between the pair of third color emitting LEDs and the second pair of the second color emitting LEDs within the second subpixel cluster;

wherein the array of pixels is arranged in a repeating array with a first subpixel cluster of a first subpixel arranged over a second subpixel cluster of a second subpixel, and a second subpixel cluster of the first subpixel arranged over a first subpixel cluster of the second subpixel.

7. The display structure of claim 1, wherein the display panel includes a first array of first pixel driver chips coupled to a first subgroup of LEDs in the matrix of LEDs in the main body area of the display area, and a second array of second pixel driver chips coupled a second subgroup of LEDs in the matrix of LEDs in the plurality of petals of the display area;
wherein:
the first array of first pixel driver chips is positioned in a first grid with a first repeating x-y pixel driver pitch; and
the second array of second pixel driver chips is positioned in a second grid of a second repeating x-y pixel driver pitch that is smaller than the first repeating x-y pixel driver pitch.

8. The display structure of claim 7, comprising:
a first global routing path connected to a column of pixel driver chips in the first array of first pixel driver chips in the main body area of the display area; and
a second global routing path that is connected to a group of the second pixel driver chips in the plurality of petals in the display area, wherein the second global routing path loops in and out of one or more petals of the plurality of petals;
wherein the plurality of petals is located along a corner of the display panel.

9. The display structure of claim 1, wherein the display panel includes a first array of first matrix tiles in the main body area of the display area, and a second array of second matrix tiles in the plurality of petals of the display area;
wherein each first matrix tile includes a first pixel driver chip coupled to a first matrix tile group of LEDs arranged in a first pattern, and each second matrix tile includes a second pixel driver chip coupled to a second matrix tile group of LEDs arranged in a second pattern different from the first pattern; and
further comprising a plurality of intermediate matrix tiles, each intermediate matrix tile including an intermediate pixel driver chip coupled to an intermediate matrix tile group of LEDs arranged in an intermediate pattern that is a portion of the first pattern.

10. A method of forming a display structure comprising:
laminating a backfilm layer onto a bottom mold with a three-dimensional (3D) compound surface curvature; and
laminating a display panel onto the backfilm layer on the bottom mold;
wherein the display panel includes a cutout pattern that defines a plurality of petals, and laminating the display panel comprises folding the plurality of petals into a curved 3D film contour on top of the laminated backfilm layer.

11. The method of claim 10, further comprising filling trenches between adjacent petals of the plurality of petals with one or more seam materials.

12. The method of claim 10, wherein laminating the display panel comprises pressing a top mold onto the display panel.

13. The method of claim 12, wherein laminating the display panel comprises pressing the top mold onto a protective film on the display panel, and pulling a plurality of tabs along a periphery of the protective film.

14. The method of claim 10, wherein laminating the display panel comprises positioning a protective film tab over the display panel, wherein the protective film tab includes a plurality of strips aligned with plurality of petals of the display panel; and
further comprising pulling the plurality of strips to fold the plurality of petals into the curved 3D film contour.

15. A method of forming a display structure comprising:
attaching a display panel to a backfilm layer;
mounting a back side of the backfilm layer on a bottom mold with a three-dimensional (3D) compound surface curvature; and
pulling a connecting line that is joined to a plurality of backfilm layer petals to fold a plurality of display panel petals into a curved 3D film contour on top of the backfilm layer.

16. A display structure comprising:
a display panel that includes pixel circuitry connected to a matrix of light emitting diodes (LEDs) within a display area of the display panel, wherein the display area includes a main body area and a plurality of petals extending from the main body area; and
a cutout through the display panel that defines a first edge of a first petal of the plurality of petals and a second edge of a second petal of the plurality of petals, wherein the first and second petals are folded and aligned with one another in a curved three-dimensional (3D) film contour such that a trench is formed between the first edge of the first petal and the second edge of the second petal within the curved 3D film contour and within the display area;
wherein the trench is filled with one or more seam materials.

17. The display structure of claim 16, wherein the display panel includes a polarizer layer, and the trench extends through the polarizer layer.

18. The display structure of claim 17, wherein the trench is substantially filled with an opaque fill material.

19. The display structure of claim 17, wherein the trench is substantially filled with an optically clear fill material.

20. The display structure of claim 19, further comprising an opaque liner material within the trench and between optically clear fill material and the first and second petals.

21. The display structure of claim 16, further comprising a polarizer layer spanning over the display area of the display panel, wherein the polarizer layer spans over the trench.

22. The display structure of claim 16, further comprising a polarizer layer spanning over the display area of the display panel and within the trench.

23. A method of forming a display structure comprising:
forming a polarizer layer stack on a convex outer surface of a display panel; and
laminating a cover plate onto a convex outer surface of the polarizer layer stack;
wherein forming the polarizer layer stack include coating an inner retarder layer on the display panel using a first solution-based technique, coating a linear polarizer layer on the inner retarder layer using a second solution-based technique, and coating an outer retarder layer on the linear polarizer layer using a third solution-based technique.

24. A method of forming a display structure comprising:
forming a polarizer layer stack on an inside surface of a concave cover plate; and
laminating the polarizer layer stack and the cover plate onto a convex outer surface of a display panel;

wherein forming the polarizer layer stack includes coating an outer retarder layer on the concave cover plate using a first solution-based technique, coating a linear polarizer layer on the outer retarder layer using a second solution-based technique, and coating an inner retarder layer on the linear polarizer layer using a third solution-based technique.

* * * * *